United States Patent
Ishikura et al.

(10) Patent No.: US 7,948,787 B2
(45) Date of Patent: May 24, 2011

(54) SEMICONDUCTOR MEMORY DEVICE

(75) Inventors: Satoshi Ishikura, Osaka (JP); Marefusa Kurumada, Kyoto (JP); Hiroaki Okuyama, Kyoto (JP); Yoshinobu Yamagami, Osaka (JP); Toshio Terano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/878,534

(22) Filed: Sep. 9, 2010

(65) Prior Publication Data

US 2011/0007575 A1    Jan. 13, 2011

Related U.S. Application Data

(62) Division of application No. 11/961,184, filed on Dec. 20, 2007, now Pat. No. 7,839,697.

(30) Foreign Application Priority Data

Dec. 21, 2006  (JP) ................................. 2006-344095
Dec. 19, 2007  (JP) ................................. 2007-327066

(51) Int. Cl.
    *G11C 5/06*    (2006.01)
    *G11C 7/00*    (2006.01)
    *G11C 7/02*    (2006.01)

(52) U.S. Cl. ................. 365/63; 365/189.15; 365/189.17; 365/206; 365/214

(58) Field of Classification Search ............... 365/63
    See application file for complete search history.

(56) References Cited

U.S. PATENT DOCUMENTS

| 5,793,669 | A | 8/1998 | Sheffield et al. |
| 6,005,796 | A | 12/1999 | Sywyk et al. |
| 6,014,338 | A | 1/2000 | Wang et al. |
| 6,105,123 | A | 8/2000 | Raje |
| 6,347,062 | B2 | 2/2002 | Nii et al. |
| 6,473,350 | B2 * | 10/2002 | Lee ............................. 365/207 |
| 6,535,453 | B2 | 3/2003 | Nii et al. |

(Continued)

FOREIGN PATENT DOCUMENTS

JP    63-205890    8/1988

(Continued)

OTHER PUBLICATIONS

Henkels, et al., "A 500 MHz 32-Word ×64-Bit 8-Port Self-Resetting CMOS Register File and Associated Dynamic-to-Static Latch," Symposium on VLSI Circuits Digest of Technical Papers, Watson Research Center, Yorktown Heights, NY, 1997.

(Continued)

*Primary Examiner* — Son L Mai
(74) *Attorney, Agent, or Firm* — McDermott Will & Emery LLP

(57) ABSTRACT

A semiconductor memory device comprises a plurality of memory cells each including a holding circuit for holding memory data, and a read-only output circuit for outputting a signal corresponding to the data held by the holding circuit. The read-only output circuit has a read drive transistor controlled in accordance with a signal held by the holding circuit. A gate length of the read drive transistor is longer than a gate length of a transistor included in the holding circuit. Alternatively, the read-only output circuit has a read access transistor controlled in accordance with a read word select signal, and a gate length of the read access transistor is longer than a gate length of a transistor included in the holding circuit.

2 Claims, 32 Drawing Sheets

U.S. PATENT DOCUMENTS

| | | | |
|---|---|---|---|
| 6,542,428 B2 * | 4/2003 | Hidaka | 365/230.03 |
| 6,807,124 B2 * | 10/2004 | Tsuda et al. | 365/230.03 |
| 6,836,439 B1 * | 12/2004 | Kang | 365/200 |
| 6,885,609 B2 | 4/2005 | Lee et al. | |
| 6,985,379 B2 | 1/2006 | Nii | |
| 7,123,504 B2 | 10/2006 | Yabe | |
| 7,139,214 B2 * | 11/2006 | Atwood et al. | 365/149 |
| 7,400,523 B2 | 7/2008 | Houston | |
| 7,400,524 B2 | 7/2008 | Otsuka | |
| 7,483,332 B2 | 1/2009 | Houston | |
| 7,489,570 B2 * | 2/2009 | Kim et al. | 365/198 |
| 7,499,312 B2 * | 3/2009 | Matick et al. | 365/154 |
| 7,525,868 B2 | 4/2009 | Liaw | |
| 7,554,163 B2 | 6/2009 | Yamada et al. | |

FOREIGN PATENT DOCUMENTS

| | | |
|---|---|---|
| JP | 2002-043441 | 2/2002 |
| JP | 2002-055130 | 2/2002 |
| JP | 2004-047003 | 2/2004 |
| JP | 2004-055130 | 2/2004 |

OTHER PUBLICATIONS

Yabuuchi, M., et al., "A 45nm Low-Standby-Power Embedded SRAM with Improved Immunity Against Process and Temperature Variations," 2007 IEEE International Solid-State Circuits Conferences, Digest of Technical Papers, ISSCC 2007 / Session 18 / SRAM / 18.3, 2007, p. 326, 327, 606, IEEE.

Joshi, R., et al., "6.6+ GHz Low Vmin, read and half select disturb-free 1.2 Mb SRAM," 2007 Symposium on VLSI Circuits Digest of Technical Papers, 978-4-900784-04-8, 24-1, 2007, p. 250-251.

Chang, L., et al., "A 5.3GHZ 8T-SRAM with Operation Down to 0.41V in 65nm CMOS," 2007 Symposium on VLSI Circuits Digest of Technical Papers, 978-4-900784-04-8, 24-2, 2007, p. 252-253.

Ishikura, S., et al., "A 45nm 2port 8T-SRAM using hierarchical replica bitline technique with immunity from simultaneous R/W access issues," 2007 Symposium on VLSI Circuits Digest of Technical Papers, 978-4-900784-04-8, 24-3, 2007, p. 254-255.

* cited by examiner

SEMICONDUCTOR MEMORY DEVICE

CROSS-REFERENCE TO RELATED APPLICATIONS

This application is a Divisional of U.S. application Ser. No. 11/961,184, filed on Dec. 20, 2007 now U.S. Pat. No. 7,839,697, claiming priority of Japanese Patent Application No. 2006-344095, filed on Dec. 21, 2006 and Japanese Patent Application No. 2007-327066, filed on Dec. 19, 2007, the entire contents of each of which are hereby incorporated by reference.

BACKGROUND OF THE INVENTION

1. Field of the Invention

The present invention relates to a semiconductor memory device which is a so-called multi-port SRAM (Static Random Access Memory) having a holding circuit (flip-flop circuit) and a read output circuit which outputs a signal corresponding to data held by the holding circuit.

2. Description of the Related Art

SRAMs include memory cells arranged horizontally and vertically and each memory cell has a holding circuit for holding memory data. Memory cells included in a multi-port SRAM each have, for example, a read-only output circuit so that read can be simultaneously performed with respect to a plurality of memory cells or read and write can be simultaneously performed. Japanese Unexamined Patent Application Publication No. 2002-43441 (FIGS. 8 and 9) discloses an example of the above-described SRAM having a circuit configuration of memory cells each including write access transistors (N3, N4) and, in addition, a read drive transistor (N8) and a read access transistor (N9), and a layout of the transistors and the like. Each of these transistors has the same gate length as that of a transistor included in the holding circuit.

There is a known SRAM which has a hierarchical bit line structure so as to increase access speed. Japanese Unexamined Patent Application Publication No. 2004-47003 and U.S. Pat. No. 6,014,338 discloses an SRAM which includes a plurality of local read bit lines and a single global read bit line and in which each memory cell is connected to a corresponding one of the local read bit lines. In such an SRAM, the length of the local read bit line can be suppressed to a small quantity, so that the parasitic capacitance can also be suppressed to a small quantity, thereby making it possible to easily achieve high-speed access.

In the above-described multi-port SRAMs, when a plurality of columns in each of which memory cells are arranged in a direction along the bit line are arranged in a direction perpendicular to the bit line, erroneous read is likely to occur. For example, in the above-described SRAMs, two memory cells belonging to the same row may be simultaneously selected for write and read. In this case, in the read memory cell, since a write access transistor goes to the ON state, the potential of an I/O node of the holding circuit varies depending on the potential of a write bit line. Therefore, the potential of a read bit line is also affected, so that erroneous read is likely to occur.

In the SRAM having the hierarchical bit line structure, a global read bit line is provided for each column. If the potentials of the global read bit lines all vary depending on signals read from memory cells in the respective columns, power is consumed corresponding to changes in the potentials.

SUMMARY OF THE INVENTION

In view of the above-described problems, the present invention has been achieved. An object of the present invention is to suppress erroneous read or easily reduce power consumption.

To achieve the object, a semiconductor memory device according to a first example of the present invention comprises a plurality of memory cells each including a holding circuit for holding memory data, and a read-only output circuit for outputting a signal corresponding to the data held by the holding circuit. The read-only output circuit has a read drive transistor controlled in accordance with a signal held by the holding circuit. A gate length of the read drive transistor is longer than a gate length of a transistor included in the holding circuit.

A semiconductor memory device according to a second example of the present invention comprises a plurality of memory cells each including a holding circuit for holding memory data, and a read-only output circuit for outputting a signal corresponding to the data held by the holding circuit. The read-only output circuit has a read drive transistor controlled in accordance with a signal held by the holding circuit, and a read access transistor controlled in accordance with a read word select signal. A gate length of the read access transistor is longer than a gate length of a transistor included in the holding circuit.

Thereby, a decrease in a threshold voltage Vt due to a short-channel effect is less likely to occur, and the consistency of semiconductors increases, resulting in less variations in threshold voltage. Therefore, the lowest threshold voltages of the read drive transistor and the read access transistor can be easily held higher than that of a transistor included in the holding circuit. Therefore, a decrease in threshold voltage of the read drive transistor or the read access transistor can be suppressed to a small quantity while a size of the transistor included in the holding circuit or the like is suppressed to a small quantity, thereby making it possible to easily suppress erroneous read.

A semiconductor memory device according to a third example of the present invention, which is a semiconductor memory device in which bit lines for reading memory data have a hierarchical bit line structure, comprises a plurality of columns including a plurality of local blocks having a plurality of memory cells and a local read bit line, the plurality of memory cells being connected to the local read bit line and the local blocks in each of the plurality of columns being arranged in a direction along the local read bit line, a global read bit line shared by a plurality of columns, and a local amplifier for driving a global read bit line in accordance with a signal output from each local block. Each memory cell includes a holding circuit for holding memory data, and a read output circuit for outputting a signal corresponding to the data held by the holding circuit to a single local read bit line. When the held data is read, only one memory cell in one local block is activated in each column. The local amplifier includes a drive transistor in which the presence or absence of application of a predetermined potential is controlled in accordance with an input signal, and a column select transistor in which the presence or absence of conduction between input and output terminals thereof is controlled in accordance with a column select signal.

Thereby, power consumption can be suppressed to a small quantity as compared to when a global bit line is provided for each column and these global bit lines are simultaneously charged or discharged. Also, it is not necessary to provide a precharge (discharge) circuit, a global bit line driver, or the like for each column, and it is not necessary to provide each element, an isolation region or the like, thereby making it possible to easily reduce the area of the semiconductor memory device.

A semiconductor memory device according to a fourth example of the present invention, which is a semiconductor memory device in which bit lines for reading memory data have a hierarchical bit line structure, comprises a plurality of local blocks each having a plurality of memory cells and a local read bit line to which the memory cells are connected, a global read bit line, a local amplifier for driving a global read bit line in accordance with a signal from each local block, a read output holding circuit for holding and outputting a signal on a global read bit line with predetermined timing, and a row decoder for generating a read word select signal for selecting one of the plurality of memory cells. Each memory cell includes a holding circuit for holding memory data, a read output circuit for outputting a signal corresponding to the data held by the holding circuit to a single local read bit line. The device further comprises a timing control circuit having a dummy global read bit line, and for controlling timing of holding a signal by the read output holding circuit based on a delay time of the dummy global read bit line.

Thereby, a data read operation is controlled with appropriate timing depending on fluctuations in power source voltage or ambient temperature, variations in characteristics of a device during manufacture, or the like, thereby making it possible to secure an operation margin so as to easily achieve correct read. Also, a timing control is automatically performed, depending on the length, parasitic capacitance or the like of the local read bit line or the global read bit line. Therefore, even when semiconductor memory devices having various numbers of memory cells in the local block and a various number of local blocks in a column are manufactured, an effort to design or adjust can be easily removed or reduced.

A semiconductor memory device according to a fifth example of the present invention, which is a semiconductor memory device in which bit lines for reading memory data have a hierarchical bit line structure, comprises a plurality of local blocks each having a plurality of memory cells and a local read bit line to which the memory cells are connected, a global read bit line, and a local amplifier for driving a global read bit line in accordance with a signal from each local block. Each memory cell includes a holding circuit for holding memory data, and a read output circuit for outputting a signal corresponding to the data held by the holding circuit to a single local read bit line. The plurality of local blocks include a small local block including a smaller number of memory cells than those in other local blocks. A capacitance element is connected to the local read bit line of the small local block.

Thereby, even if one local read bit line is shorter than the other local read bit lines, the local read bit line can be easily set to have the same parasitic capacitance as that of the other local read bit lines. Therefore, this semiconductor memory device is particularly useful for correct read.

A semiconductor memory device according to a sixth example of the present invention, which is a semiconductor memory device in which bit lines for reading memory data have a hierarchical bit line structure, comprises a plurality of columns including a plurality of local blocks having a plurality of memory cells and a local read bit line, the plurality of memory cells being connected to the local read bit line and the local blocks in each of the plurality of columns being arranged in a direction along the local read bit line, one or a plurality of global read bit lines provided, corresponding to the plurality of columns, and a local amplifier for driving a global read bit line in accordance with a signal output from each local block. Each memory cell includes a holding circuit for holding memory data, and a read output circuit for outputting a signal corresponding to the data held by the holding circuit to a single local read bit line. The device further comprises a test circuit. The test circuit determines whether or not data read from a memory cell to be tested is correct, where a memory cell to be tested is caused to store data for which a potential of a precharged local read bit line is maintained while another memory cell connected to the same local read bit line as that of the memory cell to be tested is caused to store data for which the potential of the precharged local read bit line is discharged, and the memory cell to be tested is caused to be in a read state while another memory cell selected in accordance with the same write word select signal as that of the memory cell to be tested is caused to be in a write state.

A semiconductor memory device according to a seventh example of the present invention, which is a semiconductor memory device in which bit lines for reading memory data have a hierarchical bit line structure, comprises a plurality of local blocks each having a plurality of memory cells and a local read bit line to which the plurality of memory cells are connected, a global read bit line, and a local amplifier for driving a global read bit line in accordance with a signal output from each local block. Each memory cell includes a holding circuit for holding memory data, and a read output circuit for outputting a signal corresponding to the data held by the holding circuit to a single local read bit line. The read output circuit has a read access transistor controlled in accordance with a read word select signal and a read drive transistor controlled in accordance with a signal held by the holding circuit, or the read access transistor. A source potential and a substrate potential can be separately applied to the read access transistor and the read drive transistor, or the read access transistor.

Thereby, it is possible to perform a test to correctly determine whether or not a device is defective.

DETAILED DESCRIPTION OF THE PREFERRED EMBODIMENTS

Hereinafter, embodiments of the present invention will be described with reference to the accompanying drawings. Like parts are indicated by like reference symbols throughout the specification and will not be repeatedly described.

Embodiment 1

Figure 1:
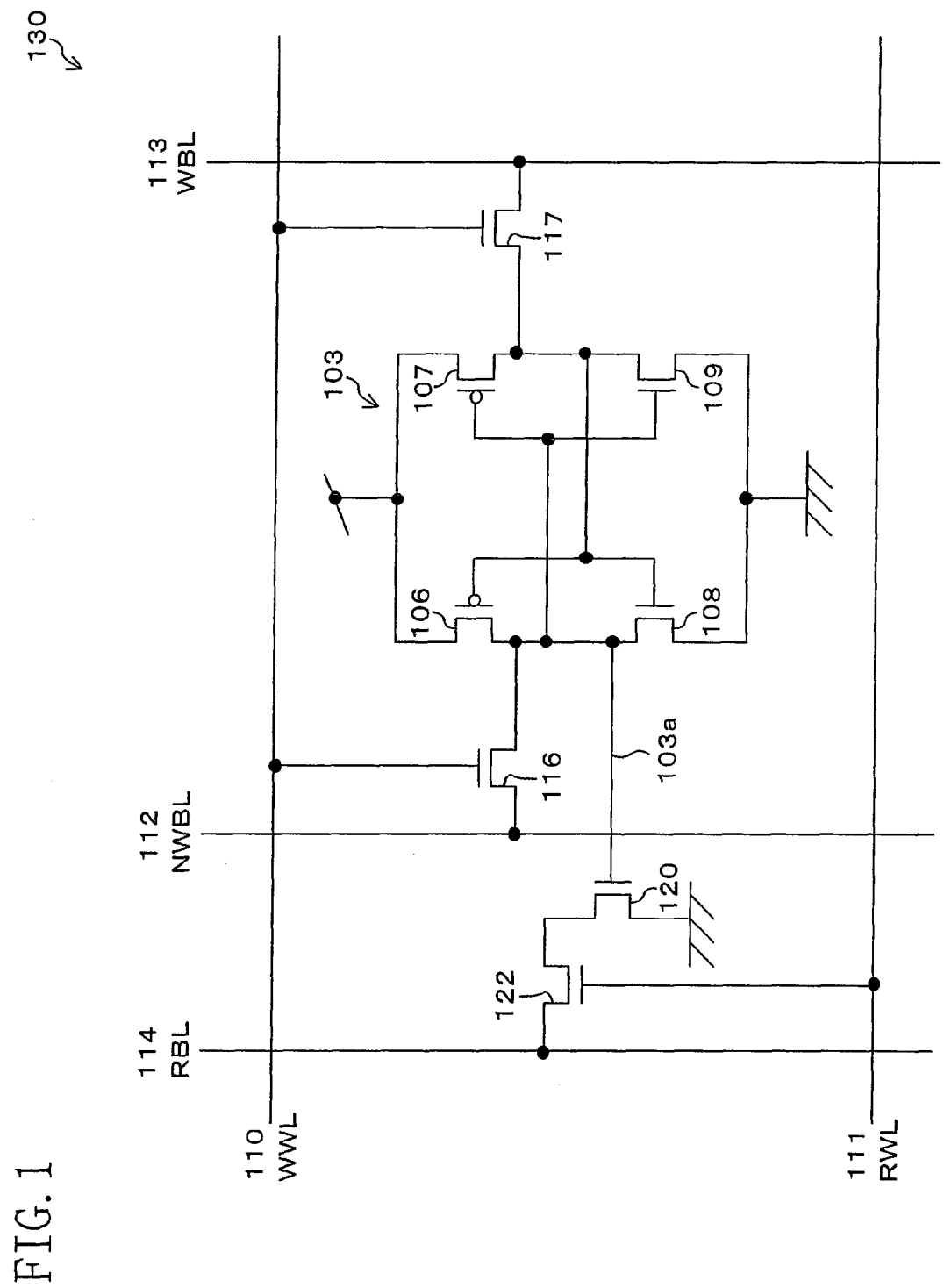
FIG. 1 is a circuit diagram showing a configuration of a memory cell provided in a semiconductor memory device according to Embodiment 1 of the present invention.

A memory cell provided in a semiconductor memory device according to Embodiment 1 has, for example, a circuit configuration as shown in FIG. 1. The memory cell 130 is a so-called dual-port eight-transistor cell which has P-channel transistors 106 and 107 (PMOS transistors), N-channel transistors 108 and 109 (NMOS transistors), write access transistors 116 and 117, a read drive transistor 120, and a read access transistor 122.

A pair of the P-channel transistor 106 and the N-channel transistor 108 and a pair of the P-channel transistor 107 and the N-channel transistor 109 each constitute a CMOS inverter. These CMOS inverters constitute a holding circuit 103 (flip-flop circuit), where the input and output terminals thereof are connected to each other. The write access transistors 116 and 117 serve as access gates (transfer gates) which cause a pair of write bit lines 112 and 113 (NWBL and WBL), respectively, to be conductive with respect to the holding circuit 103 when a write word line 110 (WWL) goes to "H (High level)". The read drive transistor 120 and the read access transistor 122 cause a read bit line 114 (RBL) to go to "L (Low level)" when a read word line 111 (RWL) is at "H" and an I/O node 103a of the holding circuit 103 is at "H".

Figure 2:
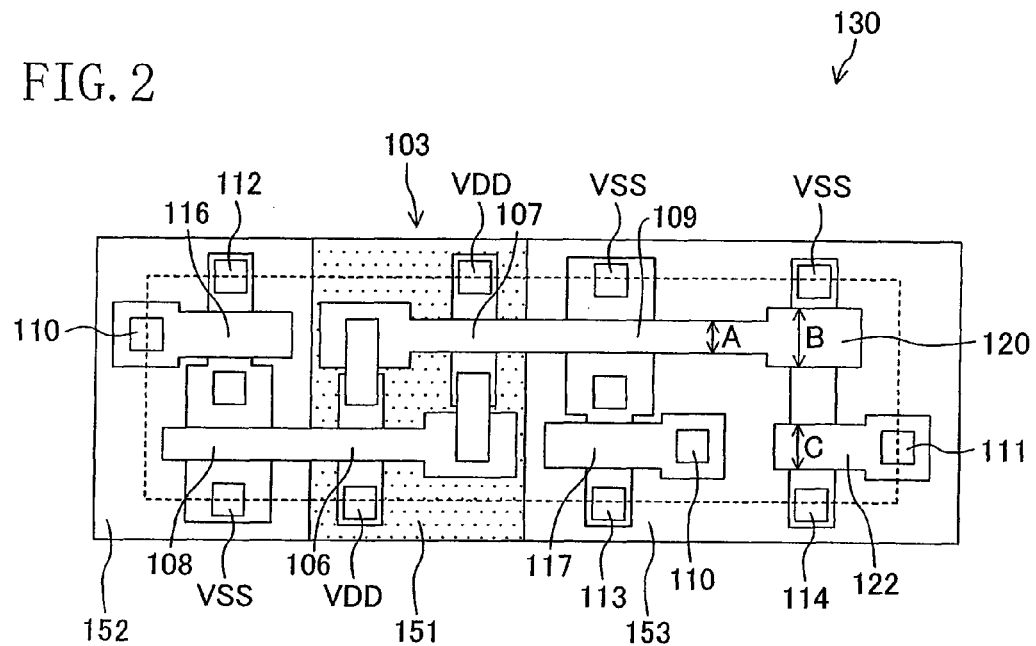
FIG. 2 is a plan view showing a layout of the memory cell.

The above-described transistors are arranged on a semiconductor substrate as shown in FIG. 2, for example. The P-channel transistors 106 and 107 are formed in an N-well region 151. The N-channel transistors 108 and 109 and the like are formed in P-well regions 152 and 153 provided on opposite sides of the N-well region 151. The gate lengths (widths of gate electrodes) A, B, and C of the N-channel transistor 108, the read drive transistor 120, and the read access transistor 122 are set to be A<B, A<C, and C<B.

With the above-described settings, in small transistors, the larger the gate length or the larger the area of a transistor, the lesser likely a decrease in a threshold voltage Vt due to a short-channel effect and the higher the consistency of semiconductors, resulting in less variations in threshold voltage. Therefore, the lowest threshold voltages of the read drive transistor 120 and the read access transistor 122 can be easily held higher than that of the N-channel transistor 109. Here, a signal held by the holding circuit 103 is determined based on a balance between characteristics of the N-channel transistors 108 and 109 and characteristics of the P-channel transistors 106 and 107, so that the influence of a variation in threshold voltage of the N-channel transistor 109 is relatively small. In contrast, the influence of a decrease in threshold voltage of the read drive transistor 120 or the read access transistor 122 on erroneous read is relatively large. Therefore, a size of the N-channel transistor 109 or the like is suppressed to a small quantity, and a decrease in threshold voltage of the read drive transistor 120 or the read access transistor 122 is reduced to a small quantity, thereby making it possible to easily suppress erroneous read.

More specifically, by setting A<B, a random variation which is determined by a device size of the read drive transistor 120 can be suppressed. In addition, even when the gate length is short within an acceptable range, a decrease in threshold voltage due to a short-channel effect can be suppressed (reduced). Thereby, in a read-only port in which an internal node is connected at the gate, of a multi-port memory having a single-end read structure, even if the potential of the I/O node 103a of the holding circuit 103 is slightly increased by an influence of the potentials of the write bit lines 112 and 113 when, for example, the write word line 110 and the read word line 111 in the same row are simultaneously switched ON, the read drive transistor 120 is unlikely to be switched ON. Therefore, it is possible to easily suppress erroneous read due to a decrease in potential of the read bit line 114 (a local read bit line in the case of a memory having a hierarchical bit line structure). Therefore, a range within read timing can be set is increased, thereby making it possible to easily design a read timing signal generating circuit and easily reduce the number of steps in design.

Also, by setting A<C, a decrease in threshold voltage of the read access transistor 122 due to a short-channel effect is suppressed. In addition, a transistor size is caused to be large, so that a random variation determined based on a device size can be suppressed. Therefore, a worst decrease in transistor threshold voltage is suppressed, so that a decrease in potential of the read bit line 114 due to an off-leakage current of the read access transistor 122 in a row in which the read word line 111 is switched OFF is suppressed, thereby also making it possible to easily suppress erroneous read.

Also, by setting C<B, an influence of erroneous read on the read bit line 114 can be reduced when the off-leakage current of the read access transistor 122 is smaller than an erroneous read current which flows due to floating of an internal node during simultaneous write/read with respect to memory cells 130 in the same row when the read access transistor 122 is in the ON state and the read drive transistor 120 is in the OFF state.

A read current of a read port is generally more dominant with respect to a cell current in the read access transistor 122 since the read access transistor 122 to the gate of which the read word line 111 is connected is affected by a substrate bias effect, so that an erroneous read current can be suppressed while suppressing a decrease in normal read cell current.

If an erroneous read current during simultaneous read/write when the write word line 110 and the read word line 111 in the same row are simultaneously switched ON is more dominant than an off-leakage current of the read access transistor 122, an erroneous read current suppressing effect can be effectively obtained within a limited memory cell area.

Figure 3:
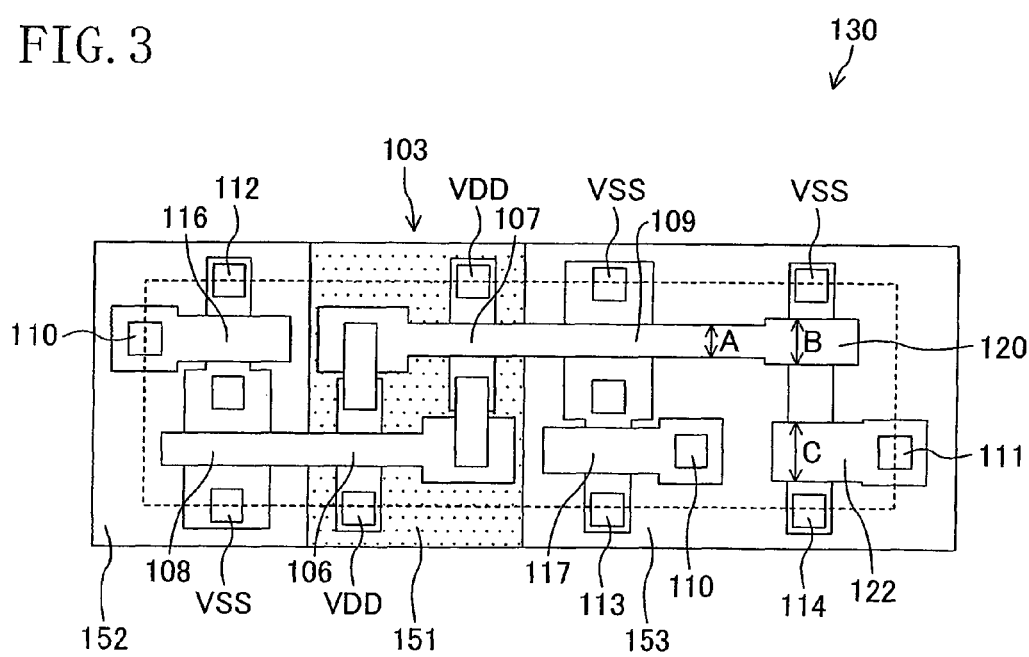
FIG. 3 is a plan view showing a variation of the memory cell layout.

Note that the present invention is not limited to the setting of C<B. For example, as shown in FIG. 3, setting of B<C is possible. In this case, if the off-leakage current of the read access transistor 122 is larger than an erroneous read current which flows due to floating of an internal node during simultaneous write/read with respect to memory cell 130 in the same row when the read access transistor 122 is in the ON state and the read drive transistor 120 is in the OFF state, the influence of erroneous read on the read bit line 114 can be effectively reduced.

When the gate width of the N-channel transistor 108 included in the holding circuit 103 of the memory cell 130 is considerably large, the floating of an internal node during a simultaneous read/write operation can be suppressed. In this case, the off-leakage current of the read access transistor 122 is more dominant than an erroneous read current during a simultaneous read/write operation when the write word line 110 and read word line 111 in the same row are simultaneously switched ON. In this case, by suppressing the off-leakage current with higher priority, it is possible to effectively obtain an erroneous read suppressing effect within a limited memory cell area.

Figure 4:
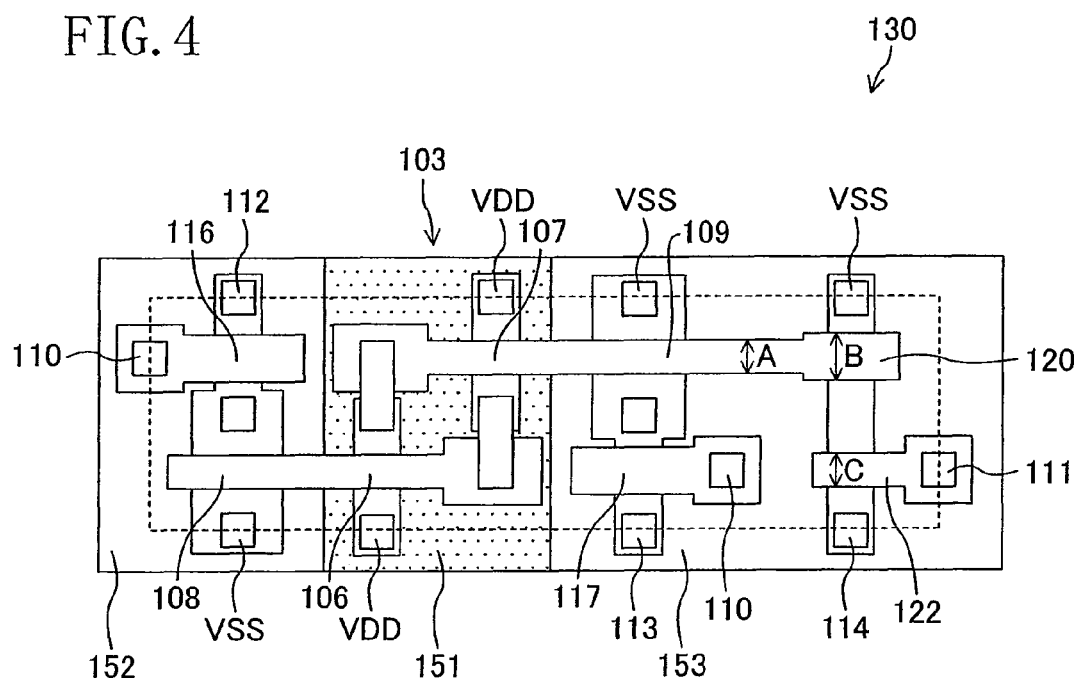
FIG. 4 is a plan view showing another variation of the memory cell layout.

The present invention is not limited to the setting of A<B and A<C. For example, only one of A<B and A<C may be set as shown in FIG. 4.

Figure 5:
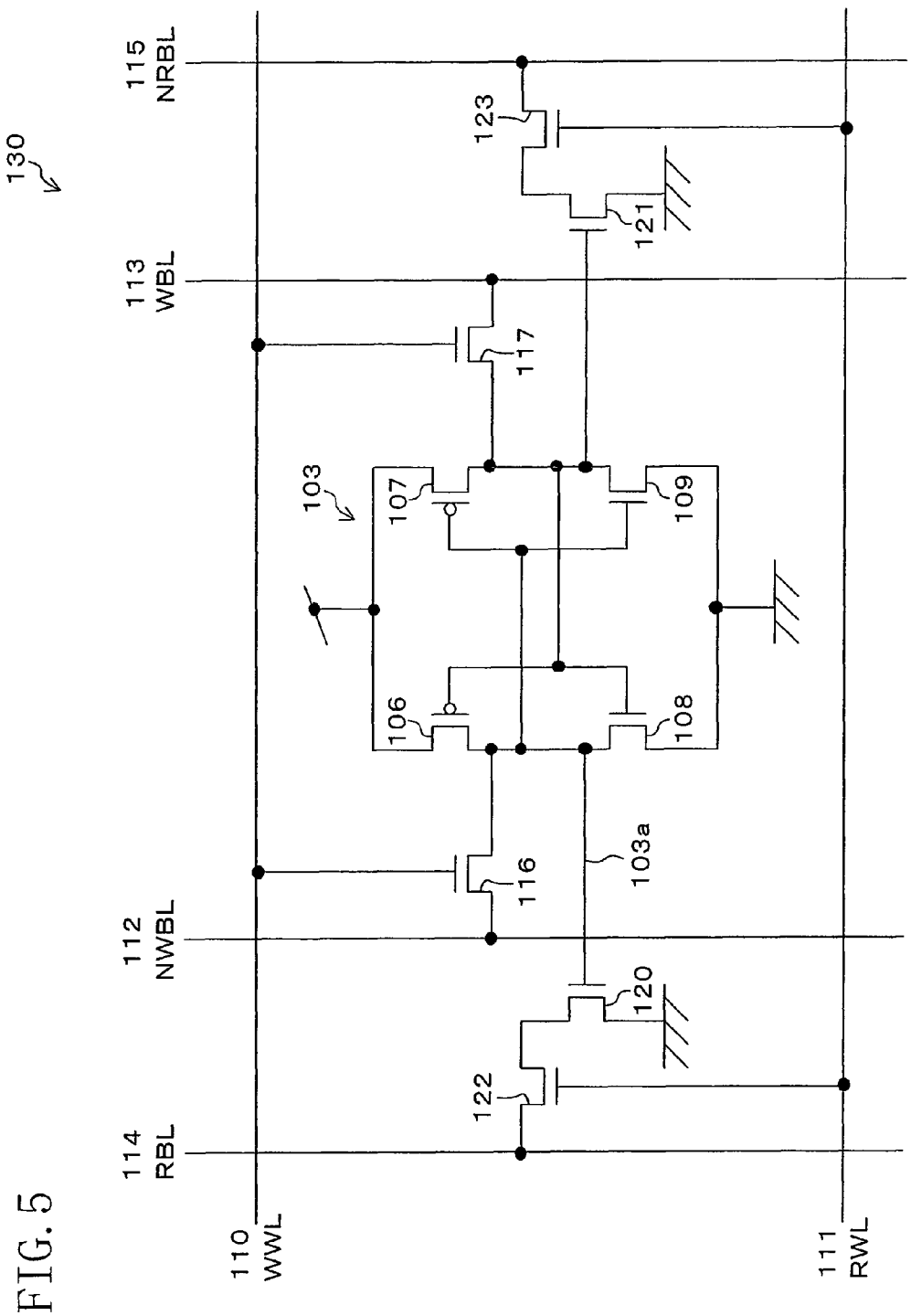
FIG. 5 is a circuit diagram showing a variation of the memory cell.
Figure 6:
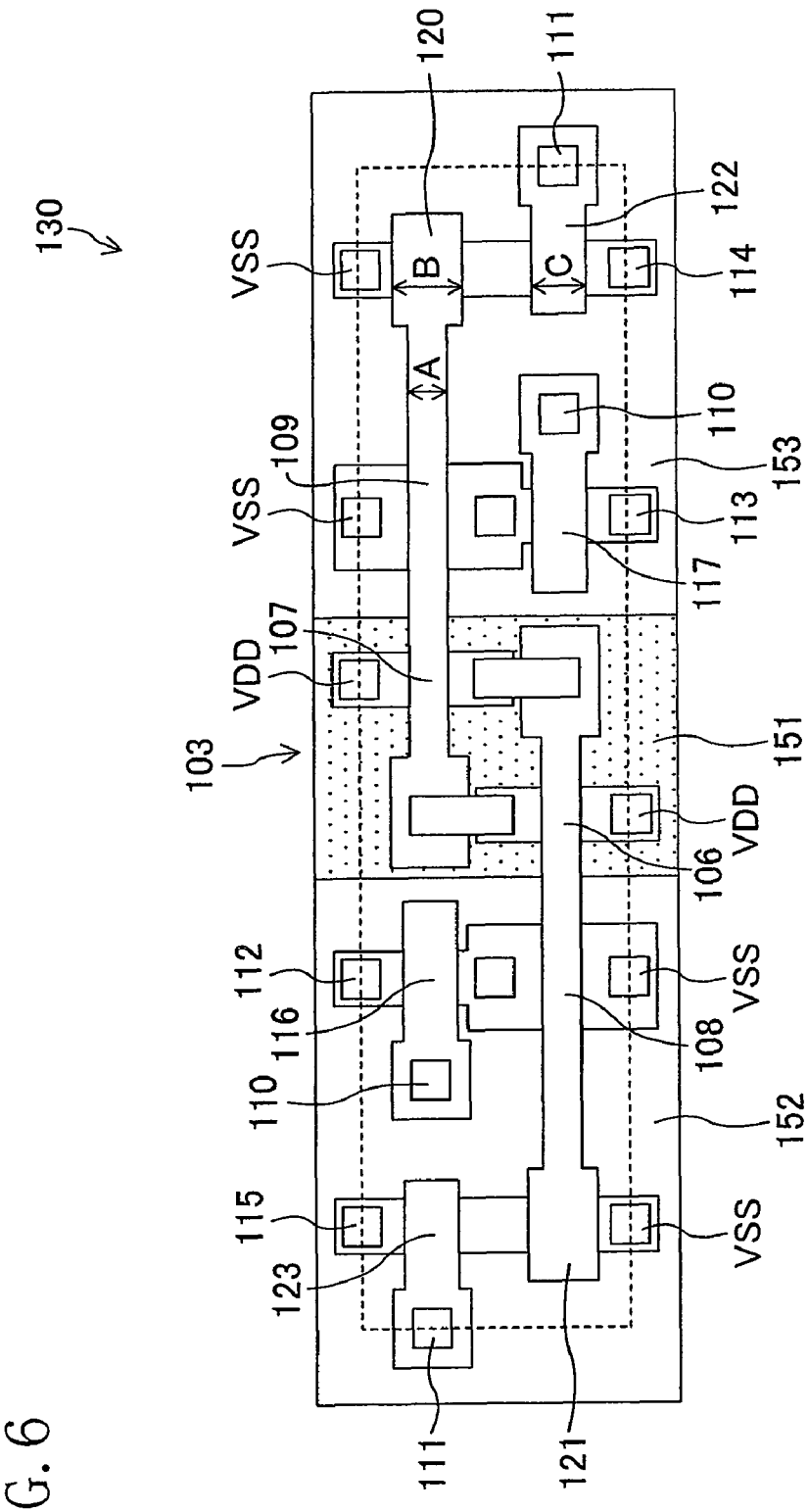
FIG. 6 is a plan view showing a layout of the variation of the memory cell.

Further, the above-described configuration is not limited to a memory cell having a single-end read structure. For example, as shown in FIGS. 5 and 6, the above-described configuration may be applied to a complementary bit line read type memory cell. Also in this case, it is possible to easily suppress a decrease in potential difference between complementary bit lines during activation of a sense amplifier by a decrease in potential of a bit line which should hold the "H" state.

Embodiment 2

Figure 7:
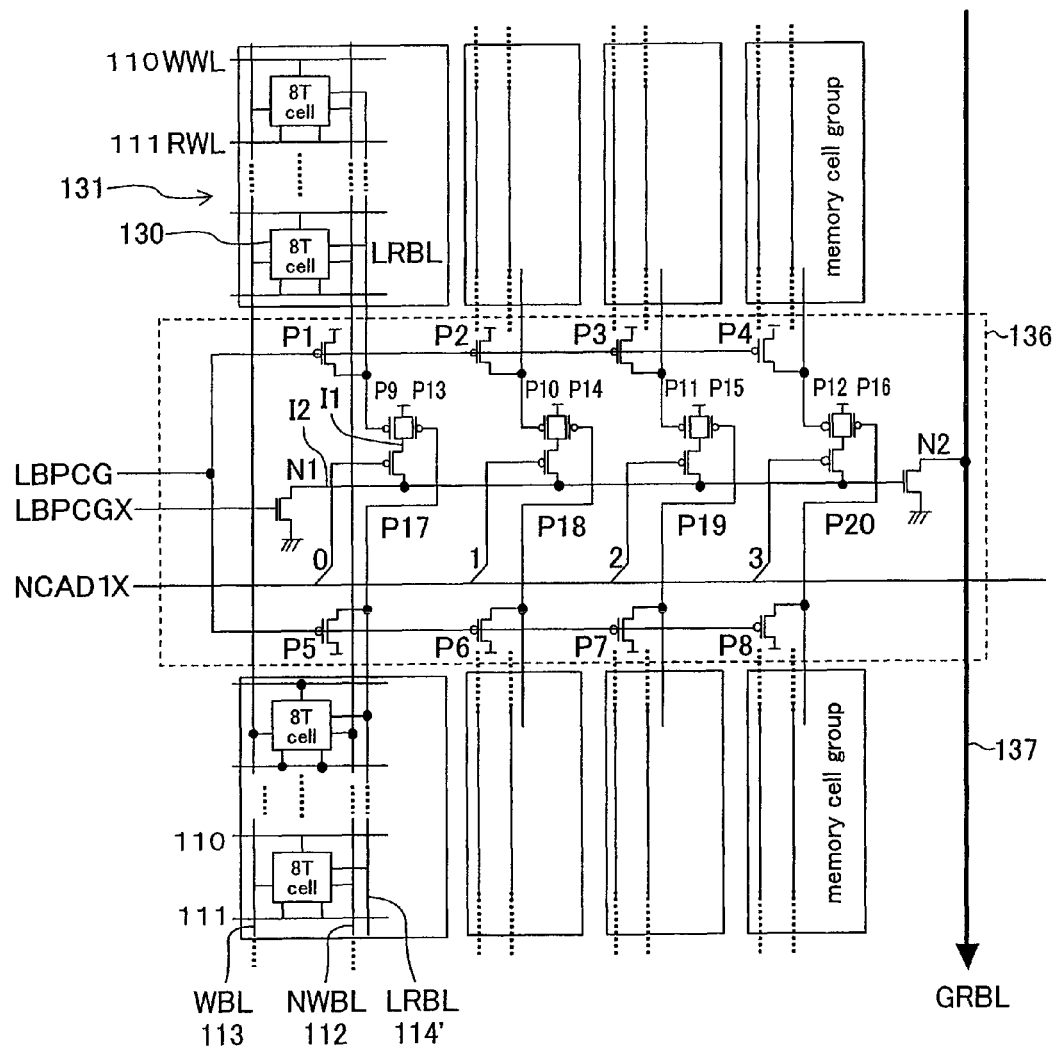
FIG. 7 is a circuit diagram showing a configuration of a major portion of a semiconductor memory device according to Embodiment 2 of the present invention.

A semiconductor memory device according to Embodiment 2 of the present invention will be described which has a hierarchical bit line structure and in which one global read bit line 137 is provided per a plurality of columns (e.g., four columns) as shown in FIG. 7, for example. In this semiconductor memory device, even when any column is subjected to read, power consumption is required for charge or discharge of only a single global read bit line 137. Hereinafter, a more specific description will be given.

In this semiconductor memory device, for example, a plurality of memory cell groups 131 (local blocks) each including a set of a plurality (e.g., 16) of memory cells 130 as described in Embodiment 1 are provided. A plurality of the memory cell groups 131 which are arranged in a direction along the global read bit line 137 constitute a column, and four columns are arranged in a direction along the word lines 110 and 111. The memory cells 130 in each memory cell group 131 are connected to an individual local read bit line 114' corresponding to the memory cell group 131, and are connected to the write bit lines 112 and 113, which are shared in the corresponding column.

A local amplifier 136 is provided between four pairs of memory cell groups 131 adjacent to each other in a direction along the global read bit line 137. The local amplifier 136 includes P-channel transistors P1 to P20 and N-channel transistors N1 and N2. The P-channel transistors P1 to P8 constitute a precharge circuit which precharges the local read bit line 114' in accordance with a precharge signal LBPCG. The P-channel transistors P9 to P16 causes a node I1 to go to "H" when the local read bit line 114' is at "L". The P-channel transistors P17 to P20 select a column in accordance with a 4-bit column select signal NCAD10-13. The N-channel transistor N1 on standby holds a node I2 at "L". The N-channel transistor N2 serves as a global bit line driver which causes the global read bit line 137 to go to "L" when the node I2 is at "H".

Figure 8:
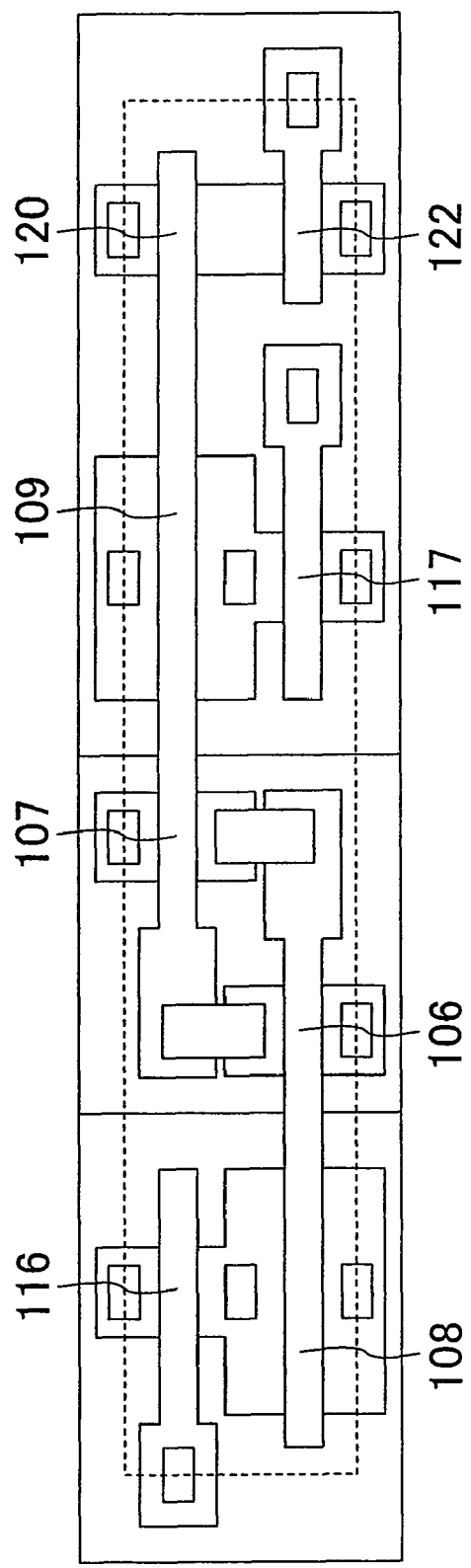
FIG. 8 is a plan view showing a layout of a transistor in a memory cell of the device of FIG. 7.
Figure 9:
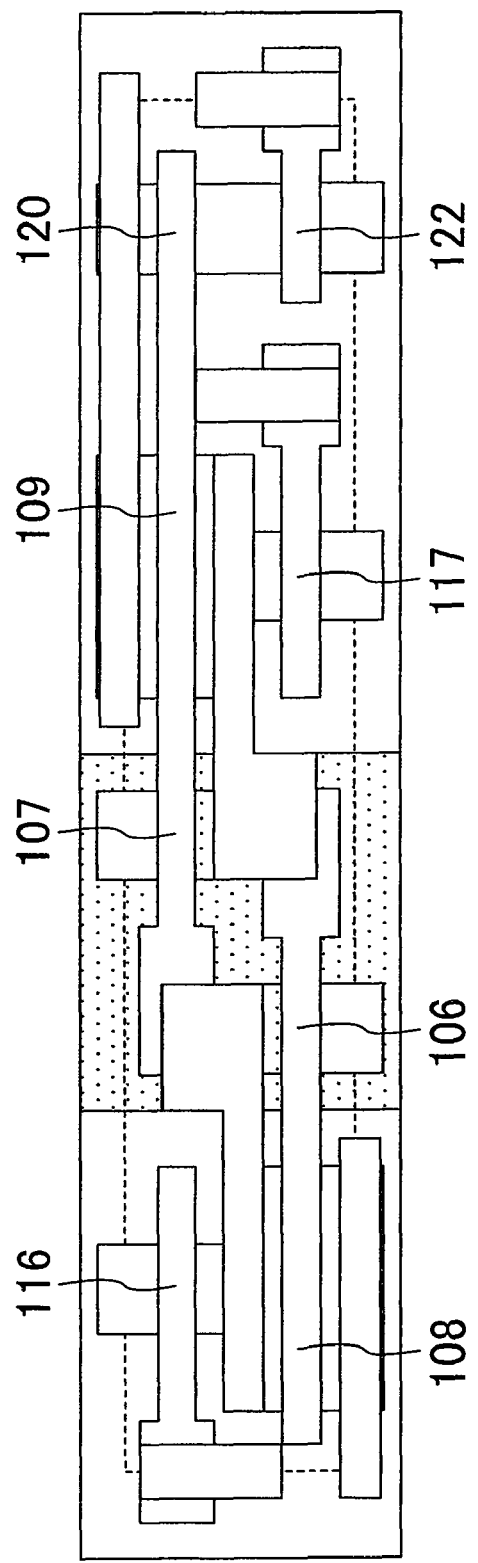
FIG. 9 is a plan view showing a wiring pattern of a first metal wiring layer of the device of FIG. 7.
Figure 10:
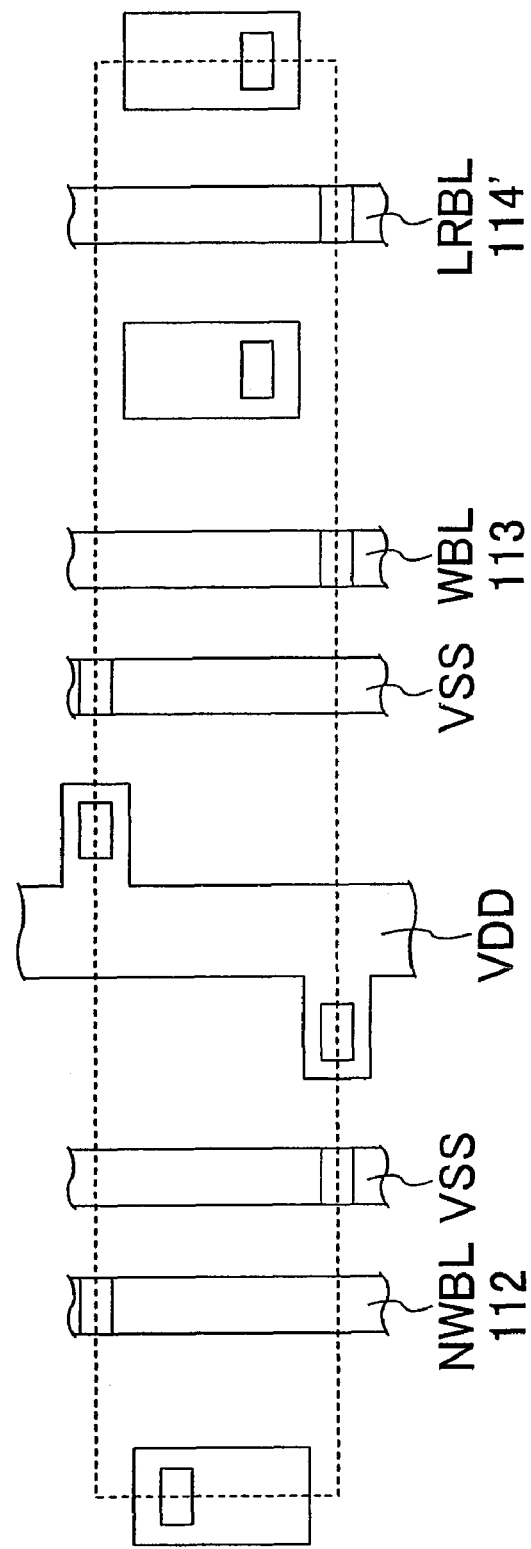
FIG. 10 is a plan view showing a wiring pattern of a second metal wiring layer of the device of FIG. 7.
Figure 11:
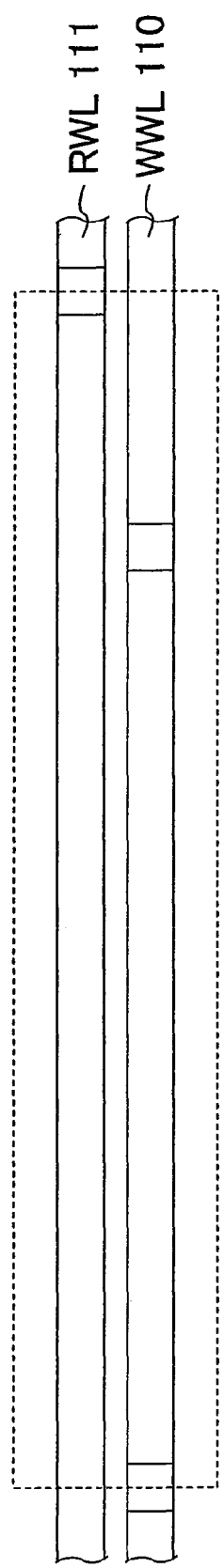
FIG. 11 is a plan view showing a wiring pattern of a third metal wiring layer of the device of FIG. 7.
Figure 12:
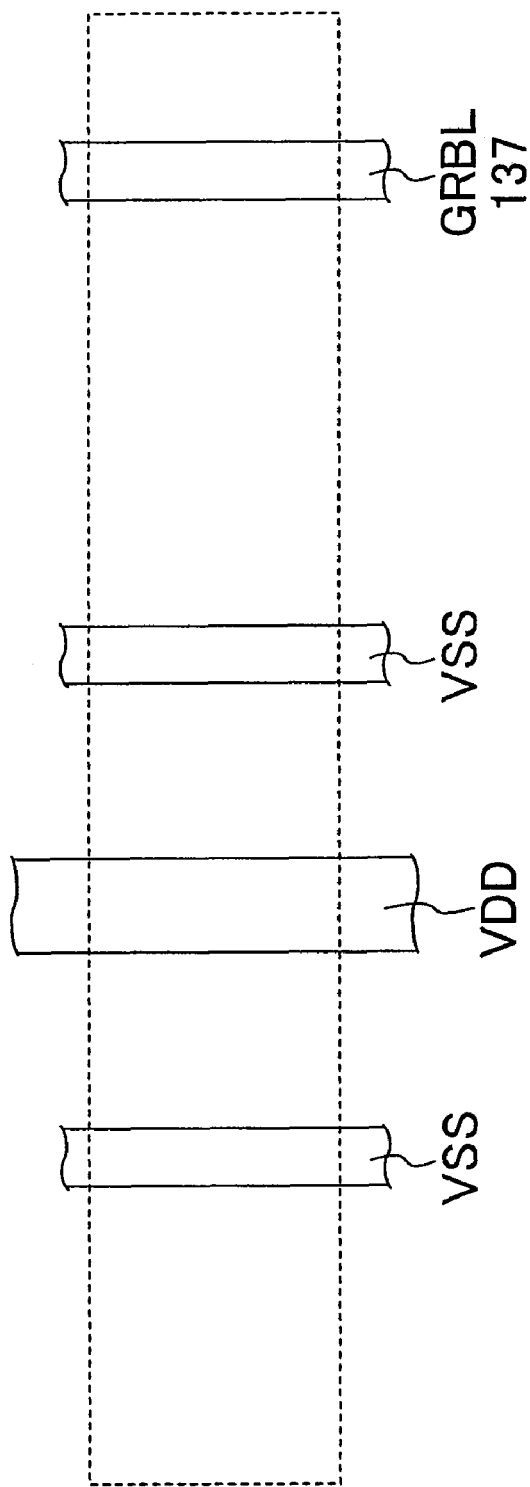
FIG. 12 is a plan view showing a wiring pattern of a fourth metal wiring layer of the device of FIG. 7.

The layout of transistors and conductors included in the memory cell 130 is not particularly limited and may be, for example, of horizontal topology as shown in FIGS. 8 to 12. FIG. 8 shows a layout of transistors including a gate electrode pattern. FIG. 9 shows a wiring pattern in a direction along the word lines 110 and 111 in a memory cell in a first metal wiring layer. FIG. 10 shows a wiring pattern (the local read bit line 114', the write bit lines 112 and 113, and the power source lines VDD and VSS, etc.) in a direction along the global read bit line 137 in a second metal wiring layer. FIG. 11 shows a wiring pattern of the word lines 110 and 111 in a third metal wiring layer. FIG. 12 shows a wiring pattern of the power source lines VDD and VSS, and a global read bit line 137 (per four columns) in a fourth metal wiring layer. The power source conductors VDD and VSS in the fourth metal wiring layer provide both shielding of an underlying layer and reinforcement of power source. When such a layout is used, wiring congestion of the second metal wiring layer is easily relaxed by using the hierarchical bit line structure. Also, only one global read bit line 137 is required per a plurality of columns in the fourth metal wiring layer. Therefore, wiring density can be easily suppressed to a small quantity, a wide wiring space can be easily secured, a coupling capacitance between the global read bit line 137 and a conductor in the same layer can be easily reduced, and low power consumption and high-speed operation can be easily provided. Also, for example, the conductor width of the global read bit line 137 can be easily increased to reduce conductor resistance or decrease the probability of short-circuit of conductors, thereby making it possible to increase the yield. Also, the width of the power source conductor can be easily increased to provide a robust power source system.

Figure 13:
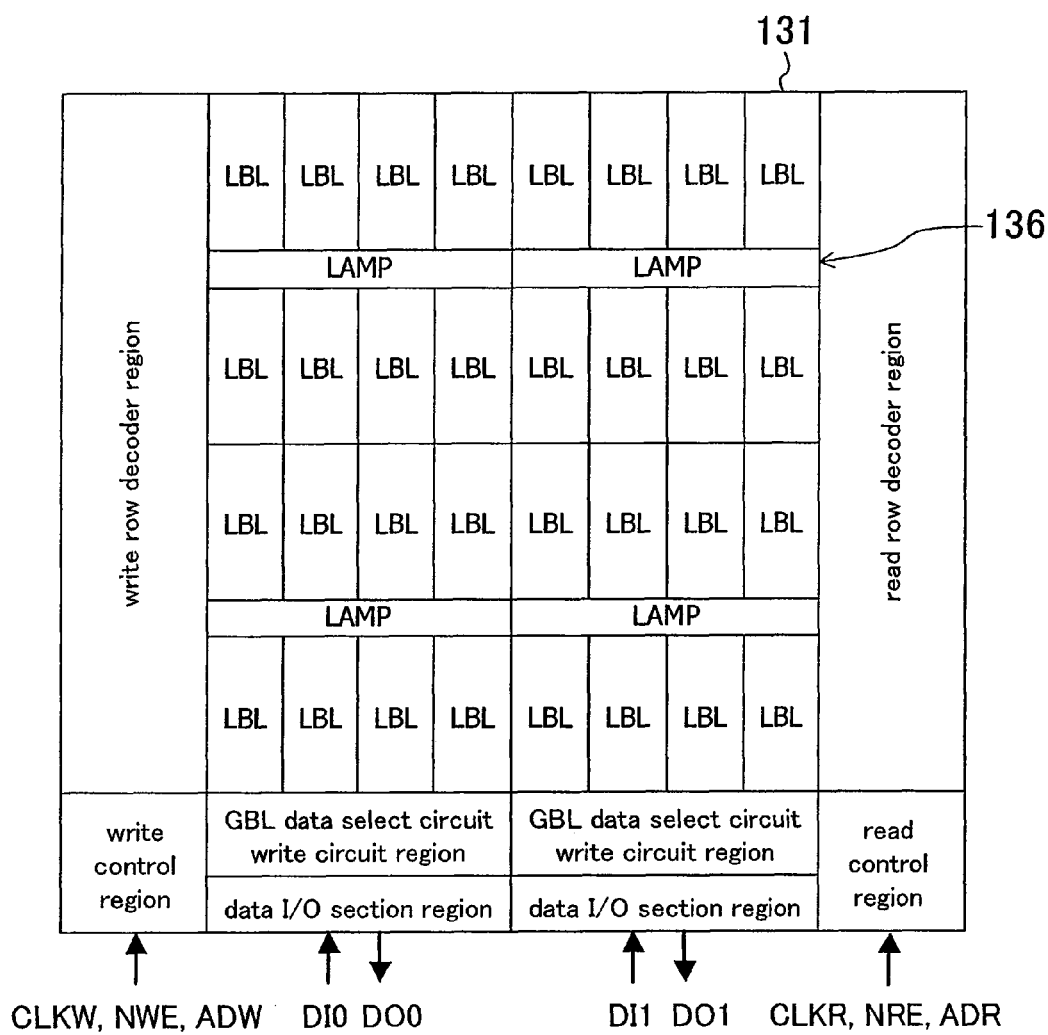
FIG. 13 is a plan view showing a layout of the memory cells and peripheral circuits of the device of FIG. 7.

Also, a layout including a peripheral circuit is not particularly limited. For example, a configuration as schematically shown in FIG. 13 can be provided. In the example of FIG. 13, a 1W-1R type dual-port SRAM including 4×8 memory cell groups 131 is provided. Specifically, separate clock signals CLKW and CLKR and separate address signals ADW and ADR are input to the write port and the read port, respectively. Therefore, write and read can be basically performed with respect to separate addresses in separate cycles and with separate clock timing.

In the above-described semiconductor memory device, power consumption can be suppressed to a small quantity as compared to when a global bit line is provided for each column and these global bit lines are simultaneously charged or discharged. Also, it is not necessary to provide a precharge (discharge) circuit, a global bit line driver, or the like for the global read bit line 137 or the node I2 for each column, and it is not necessary to provide each element, an isolation region or the like, thereby making it possible to easily reduce the area of the semiconductor memory device.

Figure 14:
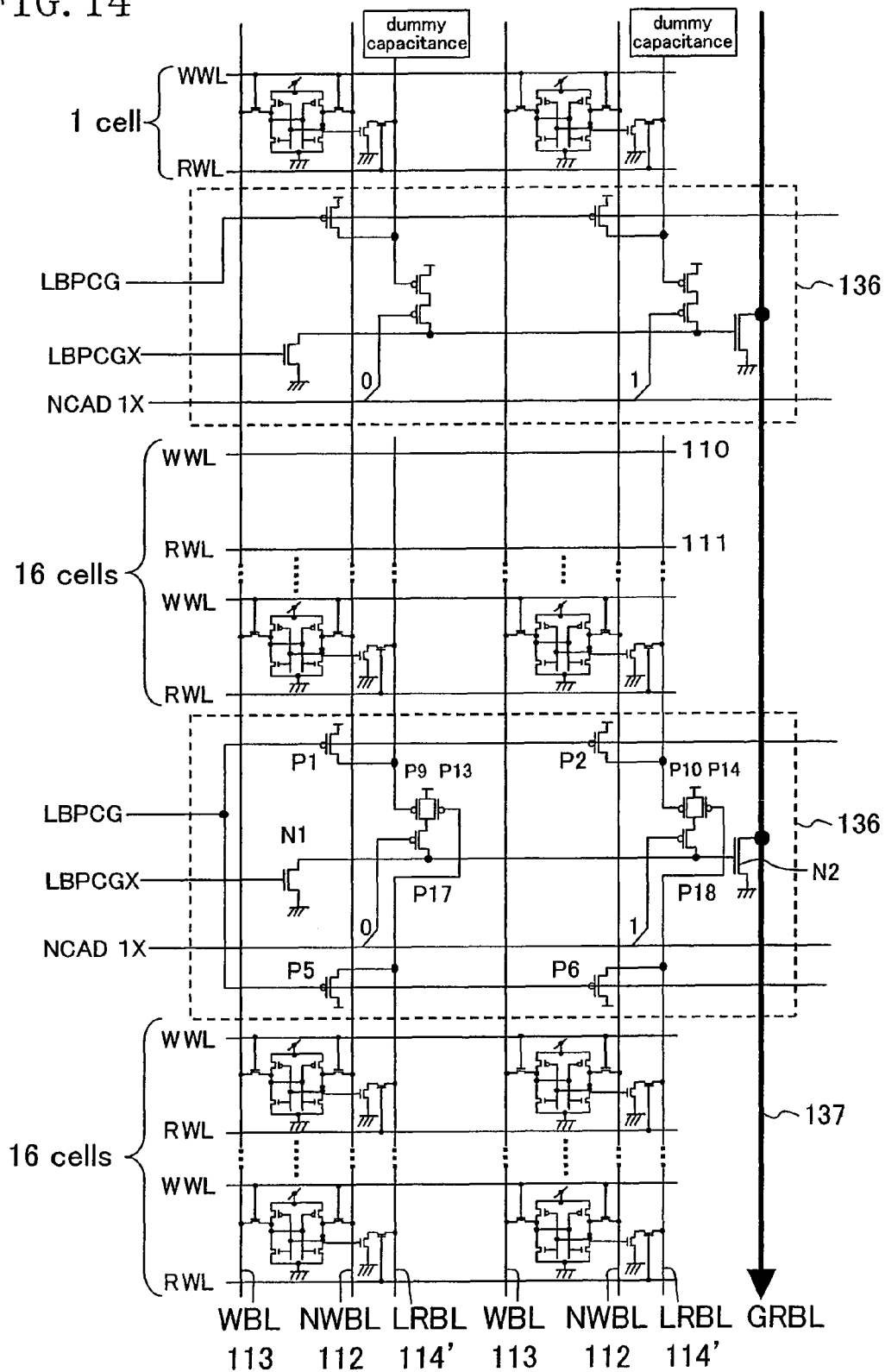
FIG. 14 is a circuit diagram showing a configuration of a major portion of a variation of the device of FIG. 7.

Note that the number of memory cells in each memory cell group, the number of memory cell groups in a column, the number of columns per global read bit line, and the like are not particularly limited and may be set to have various values. Specifically, for example, as shown in FIG. 14, one global read bit line 137 may be provided, corresponding to two columns, or the number of memory cells in a local block at an end portion of a column may be smaller than those of other local blocks. Also, the number of ports of a memory cell is not limited to two (dual-port), and three (triple-port) or more ports (read and/or write ports) may be provided.

Figure 15:
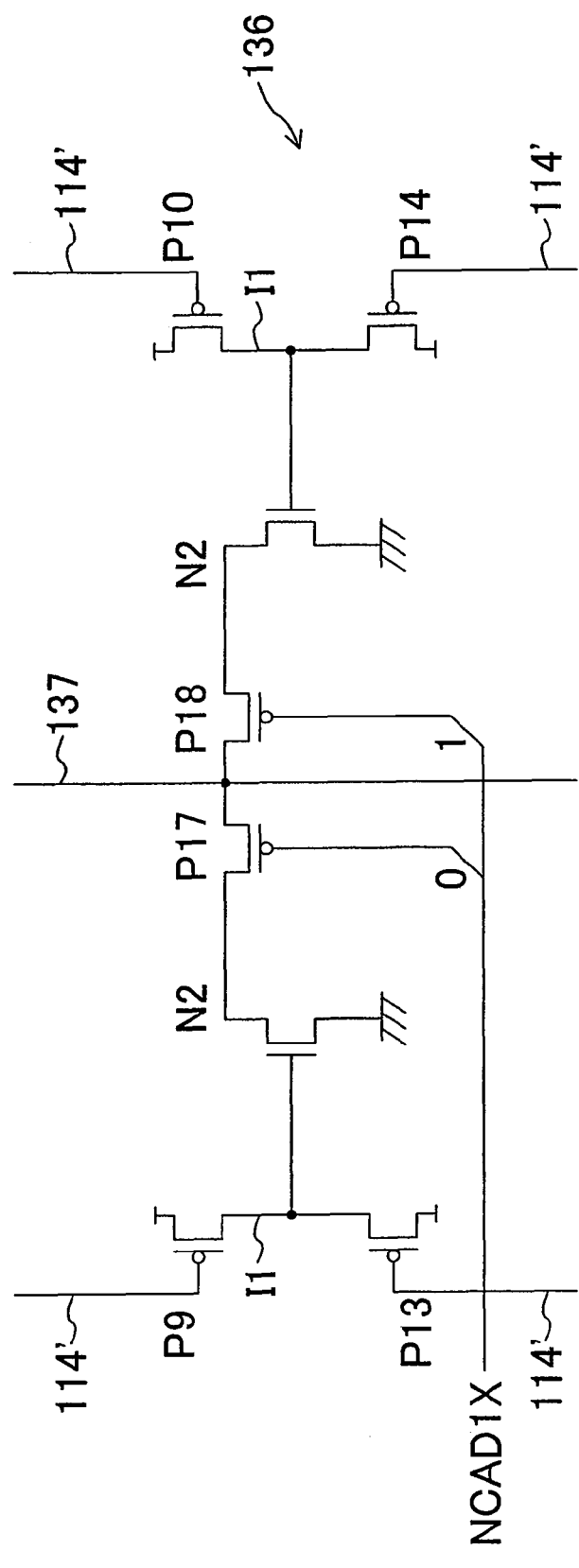
FIG. 15 is a circuit diagram showing a configuration of a local amplifier of another variation of the device of FIG. 7.

The local amplifier 136 is not limited to the above-described structure. For example, as shown in FIG. 15, an N-channel transistor N2 may be controlled in accordance with a signal of a node I1 and an output of the N-channel transistor N2 may be selected by the P-channel transistors P17 and P18 which are controlled in accordance with the column select signal NCAD10-11.

Also, a column select signal may not be input in common to the local amplifiers 136. A signal which is obtained by logical calculation of a row address signal and its decode signal may be used so that only a column select signal corresponding to a memory cell group 131 including a memory cell 130 selected by the read word line 111 goes to "L". Thereby, the level transition of a column select signal can be minimized, thereby making it possible to further suppressing power consumption to a small quantity.

Figure 16:
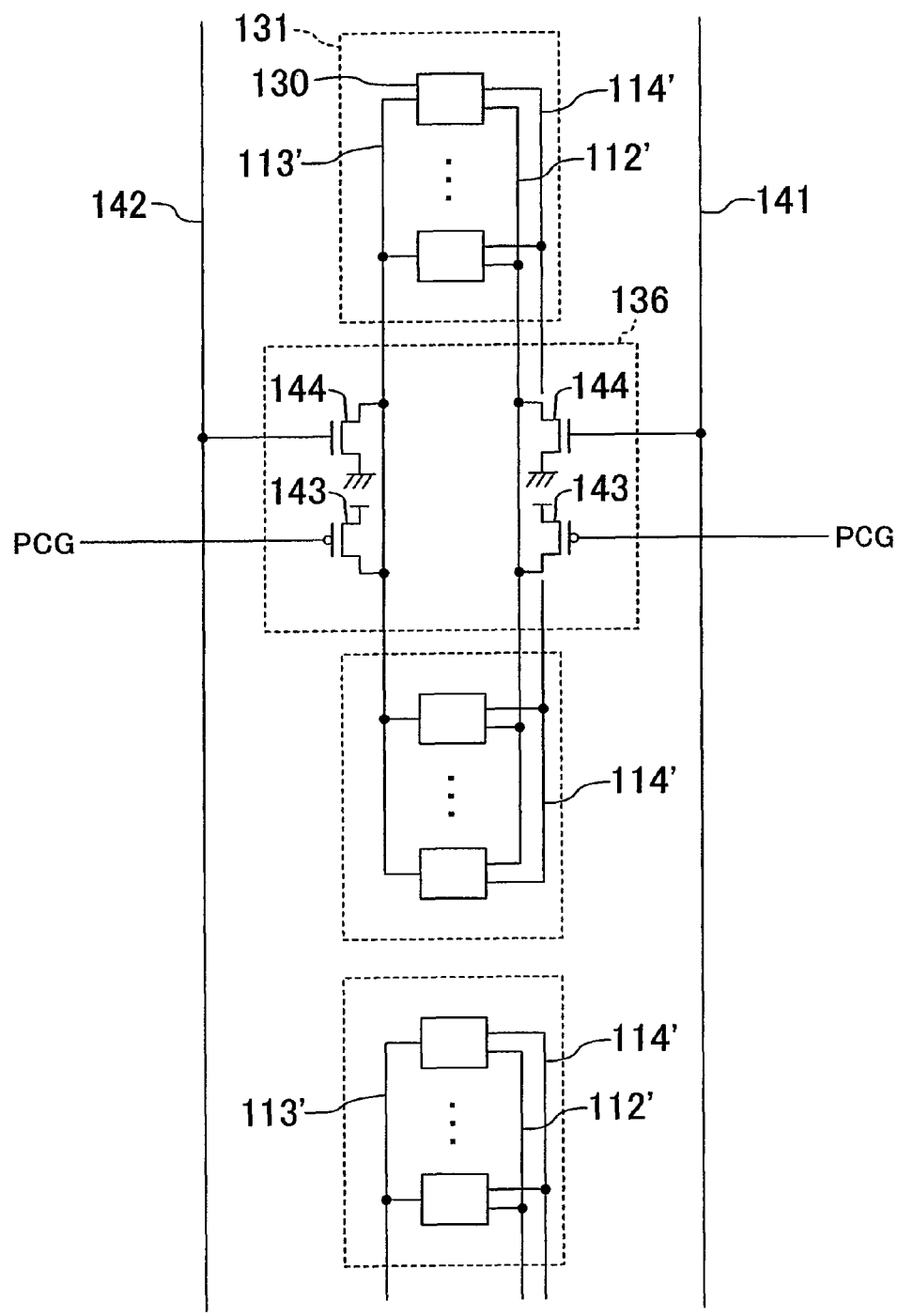
FIG. 16 is a circuit diagram showing a configuration of a major portion of still another variation of the device of FIG. 7.

Also, the write bit lines 112 and 113 may be arranged in a hierarchical manner, thereby further reducing power consumption, as disclosed in ISSCC2007, "A 45 nm Low-Standby-Power Embedded SRAM with Improved Immunity Against Process and Temperature Variations", Renesas/Matsushita. Specifically, for example, as shown in FIG. 16, local write bit lines 112' and 113', global write bit lines 141 and 142, a precharge transistor 143, and a select transistor 144 may be provided, and only levels of local write bit lines 112' and 113' corresponding to a memory cell 130 to which write is performed may be transitioned, depending on data to be written.

The local write bit lines 112' and 113' may be provided, corresponding to the same number of memory cells 130 as those to which the local read bit line 114' corresponds. Alternatively, the local write bit lines 112' and 113' may be provided, corresponding to an integral multiple of memory cells 130. In this case, the local write bit lines 112' and 113' are longer than the local read bit line 114' (the parasitic capacitance is larger). Nevertheless, since the drive ability of a write buffer provided in a data I/O section (not shown) is larger than that of the memory cell 130, the number of the precharge transistors 143 and the select transistors 144 can be suppressed to a small quantity, thereby making it possible to suppress the area of the semiconductor memory device to a small quantity, while write speed is relatively easily increased.

The precharge transistor 143 and the select transistor 144 may be provided in the same region in which the local amplifier 136 is provided. Thereby, a dead space provided between a logic circuit region and a memory cell region can be reduced, thereby making it easy to further reduce the area of the semiconductor memory device.

Embodiment 3

Figure 17:
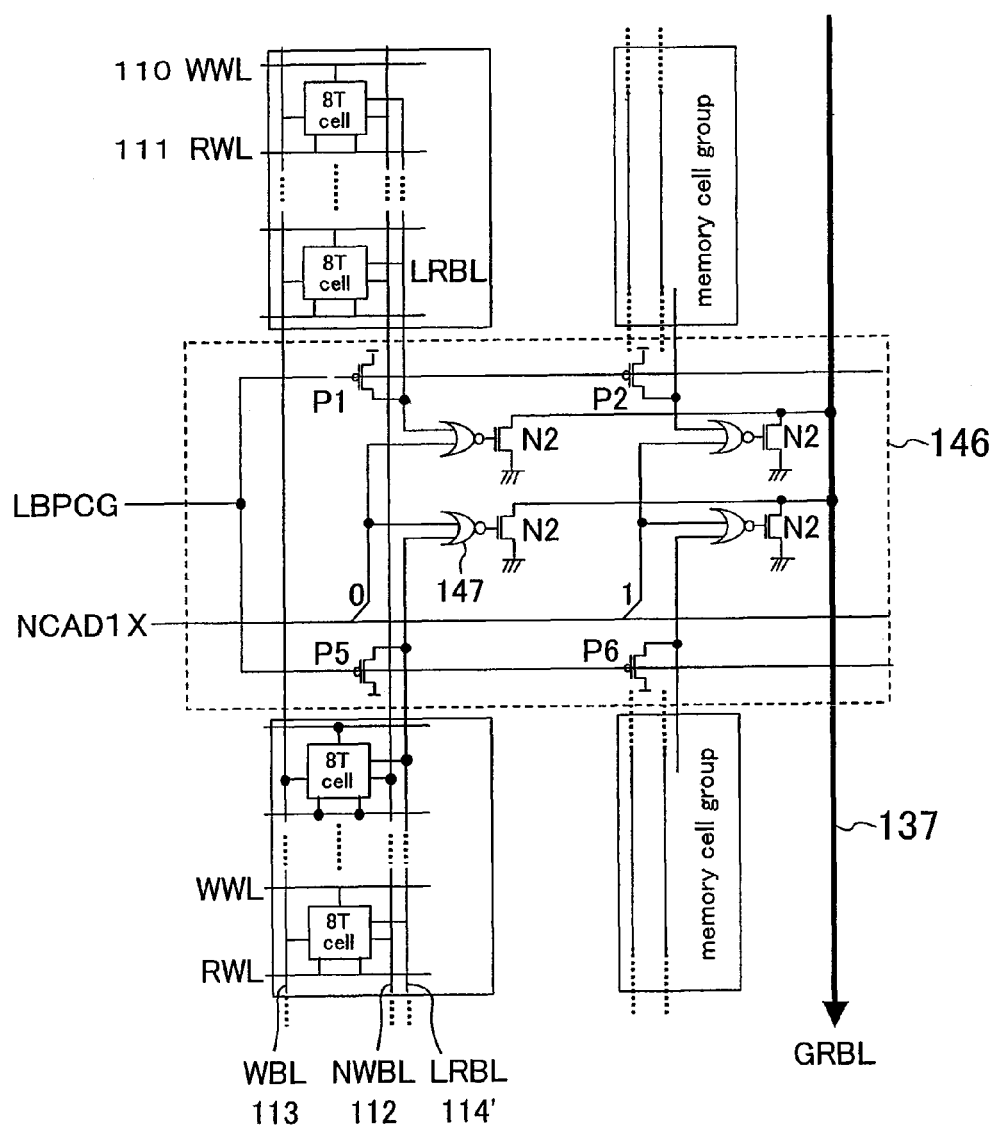
FIG. 17 is a circuit diagram showing a configuration of a major portion of a semiconductor memory device according to Embodiment 3 of the present invention.

A local amplifier 146 may be provided instead of the local amplifier 136 of Embodiment 2, as shown in FIG. 17. In the local amplifier 146, a NOR circuit 147 is provided in which a signal on the local read bit line 114' and a column select signal NCAD10-11 are input to drive an N-channel transistor N2. Also with such a configuration, only a signal corresponding to data held by a memory cell 130 in a column selected in accordance with a column select signal is transferred to a single global read bit line 137, so that power consumption can also be suppressed to a small quantity and a wiring area can be easily reduced.

Note that, when the local amplifier 146 is used, a global read bit line 137 may be provided for each column. Also in this case, the potential of a global read bit line 137 in a column which is not selected in accordance with a column select signal is not transitioned irrespective of data stored in a memory cell 130, thereby also making it possible to reduce power consumption. In addition, a conductor connecting each N-channel transistor N2 and a global read bit line 137 can be caused to be short, thereby making it possible to suppress a delay due to the parasitic capacitance of the conductor to a small quantity.

Also in Embodiment 3, various variations as described in Embodiment 2 may be applicable.

Embodiment 4

An exemplary semiconductor memory device having a hierarchical bit line structure in which read can be more correctly performed will be described.

Figure 18:
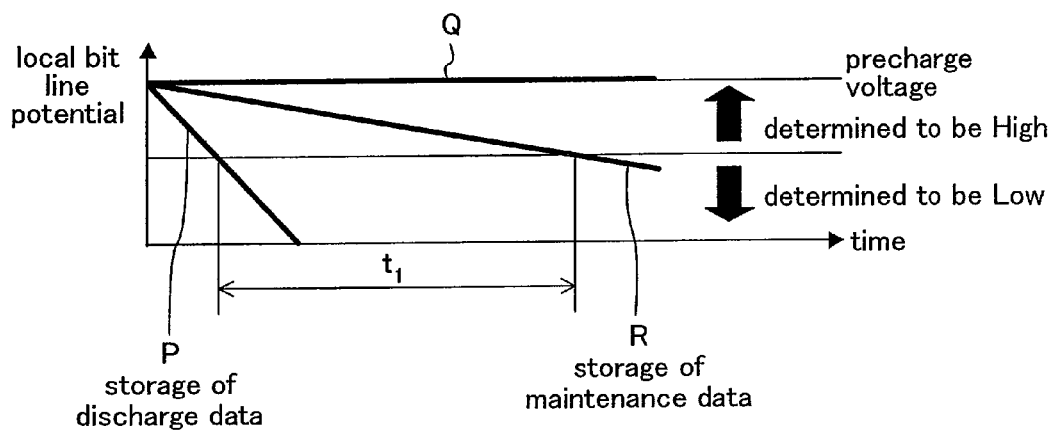
FIG. 18 is a diagram for describing exemplary timing of reading memory data.
Figure 19:
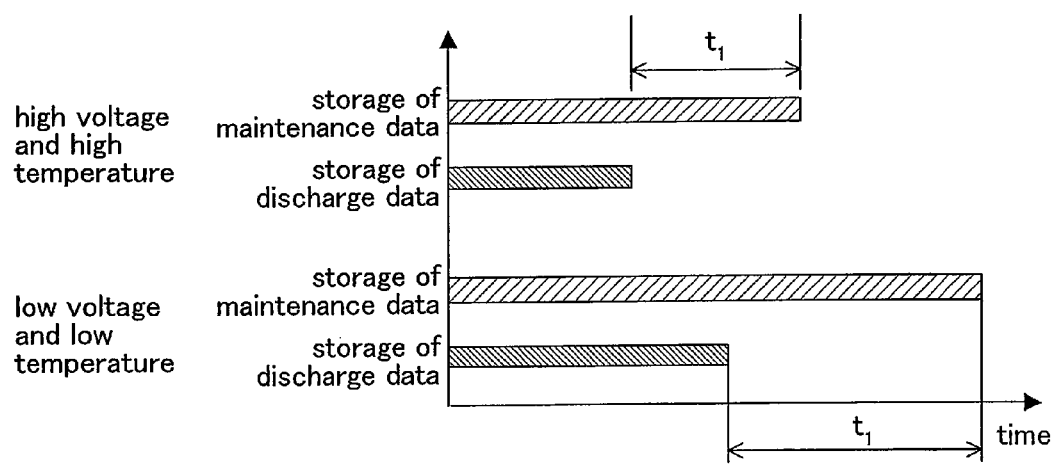
FIG. 19 is a diagram for describing exemplary variations in timing of reading memory data.

Firstly, timing of reading memory data will be described with reference to FIG. 18. If data stored in a memory cell is data for which a local bit line is discharged (discharge data), then when a row is selected by a read word line, the potential of the local bit line rapidly decreases as indicated by a reference symbol P. On the other hand, if data stored in a memory cell is data for which the potential of a local bit line is maintained (maintenance data), the potential of the local bit line ideally does not change as indicated by a reference symbol Q. Actually, the potential of the local bit line gradually decreases due to an influence of off-leakage of a read access transistor or the like as indicated by a reference symbol R. Therefore, in order to achieve appropriate read, a read signal corresponding to the potential of a global bit line needs to be latched with timing during a time period t1 (more specifically, timing corresponding to the transition of the potential of a corresponding global bit line). The time period t1 varies depending on a power source voltage, ambient temperature, or the like as shown in FIG. 19.

Figure 20:
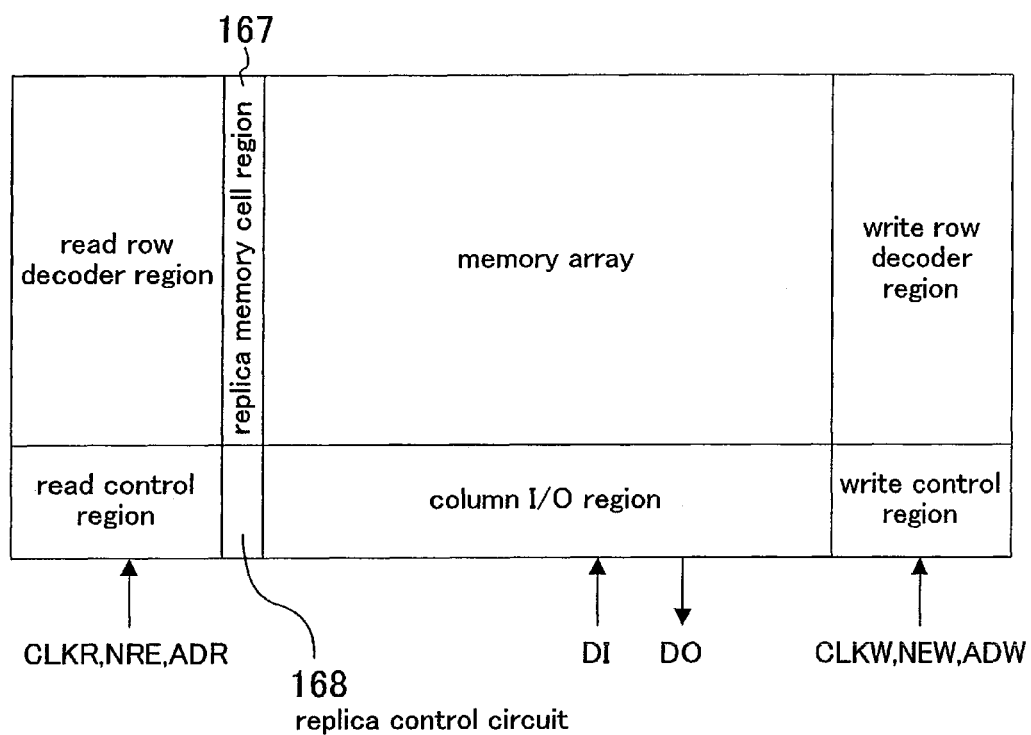
FIG. 20 is a diagram schematically showing a configuration of a semiconductor memory device according to Embodiment 4 of the present invention.

Therefore, in the semiconductor memory device of Embodiment 4, as shown in FIG. 20, a replica memory cell 167 (dummy memory cell) and a replica control circuit 168 (dummy read output circuit) are used to control timing of latching a read signal.

Figure 21:
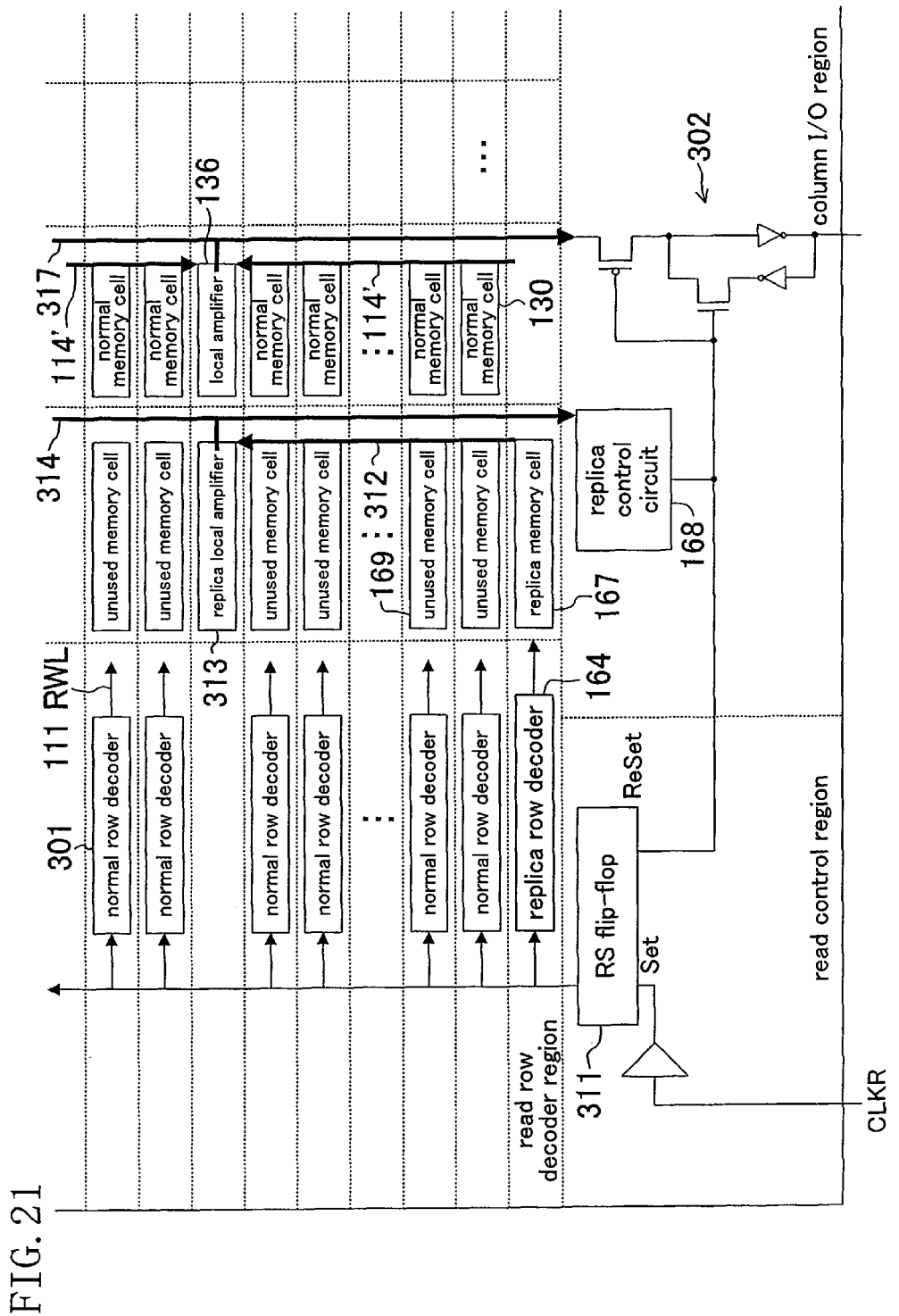
FIG. 21 is a block diagram showing a detailed configuration of the device of FIG. 20.

More specifically, for example, as shown in FIG. 21, an RS flip-flop 311 is provided in a read control region.

In a read row decoder region, a replica row decoder 164 (dummy row decoder) is provided in addition to a normal row decoder 301 which is similar to that provided in a typical semiconductor memory device.

In a replica memory cell region, the replica memory cell 167, an unused memory cell 169, a replica local read bit line 312 (dummy local read bit line), a replica local amplifier 313 (dummy local amplifier), and a replica global read bit line 314 (dummy global read bit line) are provided.

In a column I/O region, the replica control circuit 168 is provided in addition to an output circuit 302 having a latch function which is similar to that provided in a typical semiconductor memory device.

The RS flip-flop 311 is set with the rise of a read clock signal CLKR, and is reset in accordance with a timing signal output from the replica control circuit 168.

The replica row decoder 164 outputs a read word signal for all read addresses with the same timing as that of the normal row decoder 301 during a time period during which the RS flip-flop 311 is set.

Figure 22:
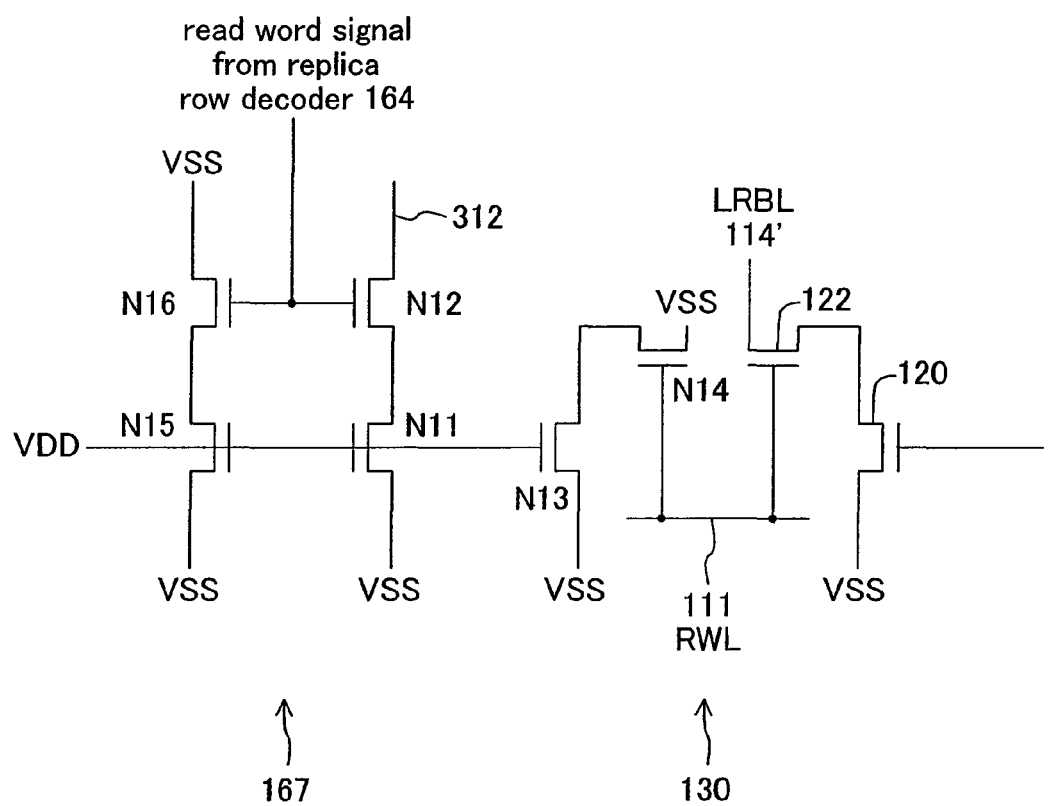
FIG. 22 is a circuit diagram showing a configuration of a replica memory cell of the device of FIG. 20.
Figure 23:
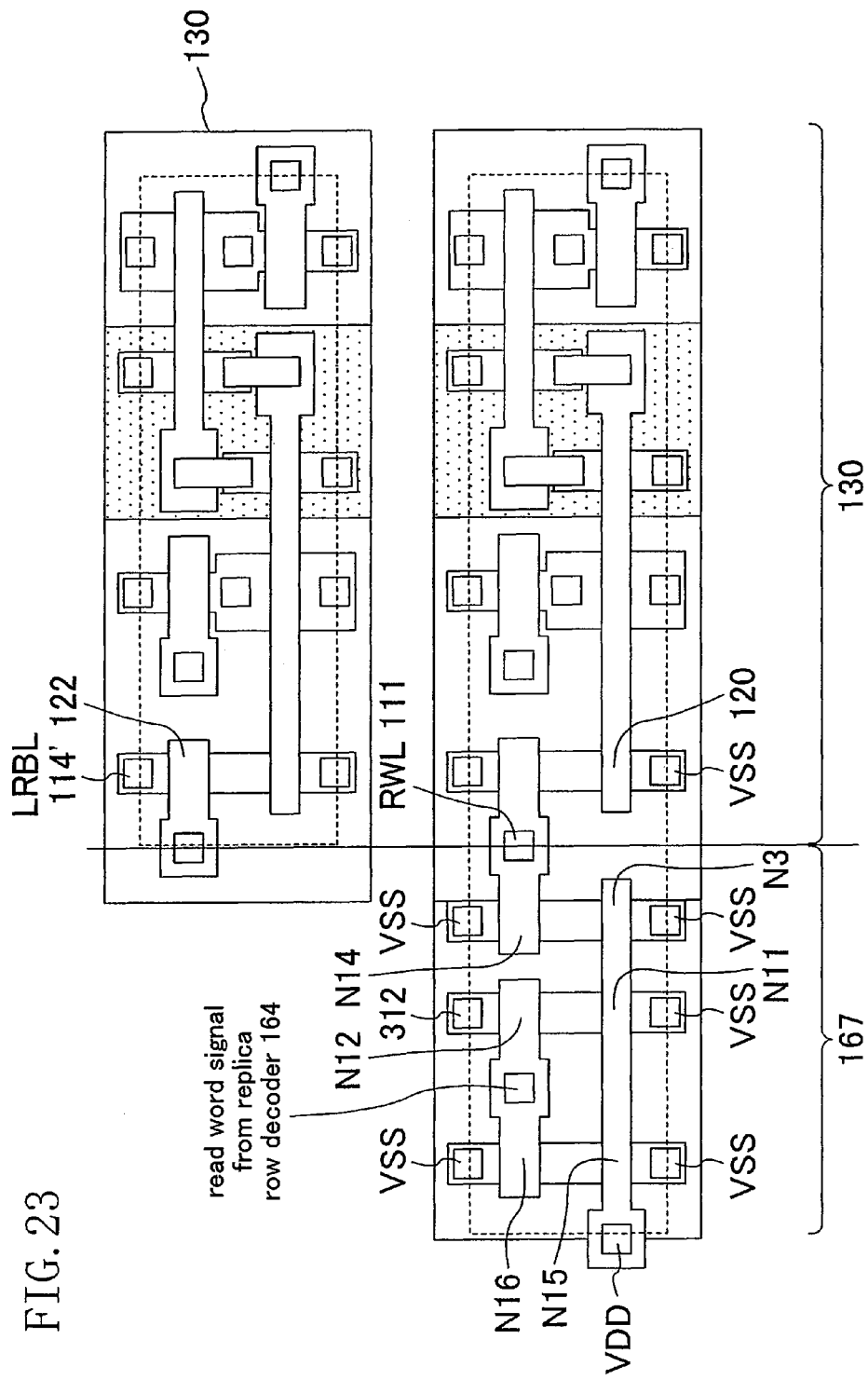
FIG. 23 is a plan view showing a layout of the replica memory cell of the device of FIG. 20.

The replica memory cell 167 has, for example, a circuit configuration and an element layout as shown in FIGS. 22 and 23. N-channel transistors N11 and N12 invariably discharge the replica local read bit line 312 in accordance with a read word signal output from a replica row decoder 164. Although N-channel transistors N13 to N16 are not required in terms of functionality, the N-channel transistors N13 and N14 are provided so as to provide a gate conductor connected to a normal read word line 111 at a border between the replica memory cell 167 and the normal memory cell 130 in a layout pattern. Also, N-channel transistors N15 and N16 are provided as optical dummies. Although a latch circuit may be provided as in a typical memory cell 130, the area can be reduced by removing the latch circuit.

The same number of replica local amplifiers 313 as typical local amplifiers 136 are provided and used to discharge the replica global read bit line 314 in accordance with a signal on the replica local read bit line 312 as in the local amplifier 136. Note that at least one of the replica local amplifiers 313 is configured to operate in accordance with a signal on the replica local read bit line 312, while, in the other replica local amplifiers 313, the gates of only the N-channel transistors N2 which drive the replica global read bit lines 314 in the typical local amplifiers 136 are connected to VSS.

The replica control circuit 168 outputs a timing signal with predetermined timing corresponding to a delay amount of the output circuit 302, depending on the potential of the replica global read bit line 314.

With the above-described configuration, the output circuit 302 is controlled with appropriate timing depending on fluctuations in power source voltage or ambient temperature, variations in characteristics of a device during manufacture, or the like, thereby making it possible to secure an operation margin so as to easily achieve correct read. Also, a timing control is automatically performed, depending on the length, parasitic capacitance or the like of the local read bit line 114' or the global read bit line 137. Therefore, even when semiconductor memory devices having various numbers of memory cells 130 in a memory cell group 131 and a various number of memory cell groups 131 in a column are manufactured, an effort to design or adjust can be easily removed or reduced.

More specifically, a replica circuit which generates read timing is configured using a circuit which is used for an actual read operation. Therefore, a correct replica operation can be provided with respect to an actual read operation irrespective of, for example, variations in width of a gate electrode, variations in implanted impurities in a diffusion region of a memory cell, variations in conductor capacitance due to a wiring layer, an inter-wiring film thickness, the diameter of a via hole, or the like. Therefore, stable measures can be taken against erroneous read. Therefore, for example, in a semiconductor memory device which has a leakage current of an access transistor at a read port, or particularly, includes a memory cell having the read drive transistor 120, it is possible to easily prevent erroneous read which occurs when the potential of a local bit line which is normally expected to hold the "H" state decreases to the "L" state due to a simultaneous write/read operation in the same row or the like. Thereby, read timing is optimally set between a normal read operation and an erroneous read current, thereby making it possible to provide a product having good characteristics.

In recent years, many minuscule SRAMs have a redundant relief function. However, as described above, in a cell having a considerably small cell current during normal read or a cell which is at a level which causes erroneous read, even when cell characteristics are changed from predetermined characteristics due to variations in a finishing process, an exponential increase in the number of defective bits is avoided, so that a number of redundant spare cells can be used instead of, for example, defective memory cells occurring during manufacture, thereby making it possible to increase the yield.

Figure 24:
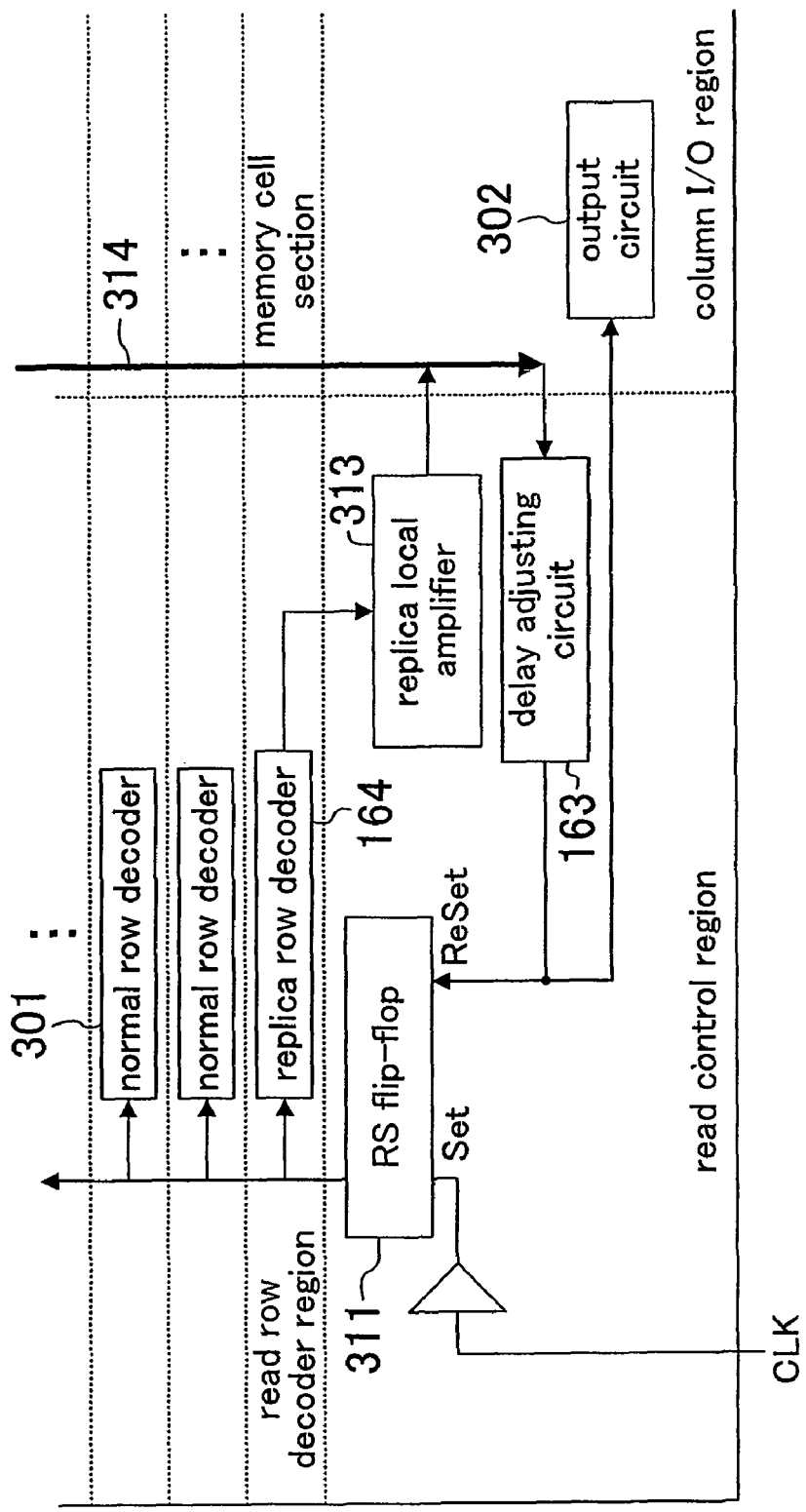
FIG. 24 is a block diagram showing a variation of the device of FIG. 20.

Note that not all of the replica circuits and conductors may be provided. For example, as shown in FIG. 24, instead of the replica memory cell 167, the replica local read bit line 312, and the replica control circuit 168, a delay adjusting circuit 163 which has a delay time corresponding to a delay time of those elements may be used. Also in this case, a timing control can be appropriately performed, mainly depending on a delay time due to the replica local amplifier 313 and the replica global read bit line 314. In addition, the delay adjusting circuit 163 can be easily configured using a transistor in a peripheral circuit logic section, but not in a memory array section. Therefore, for example, when an empty layout space is present in the control section or the like because of a relationship in size between a data I/O section and a row decoder section, a replica layout arrangement including an inverter delay or the like may be provided in the space, thereby making it possible to provide the above-described effect using a smaller area than when a replica memory cell or the like is provided in a memory array.

Figure 25:
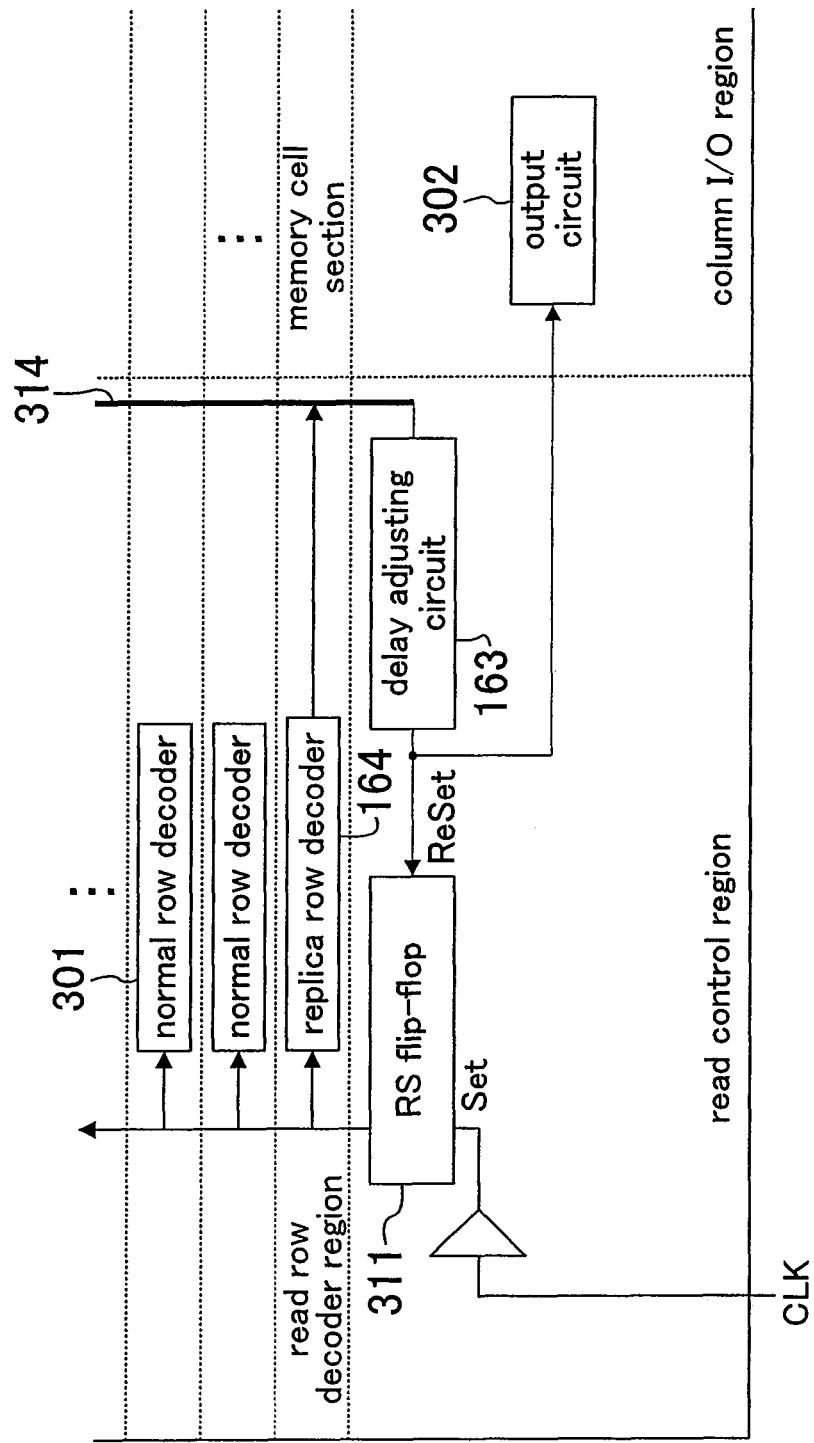
FIG. 25 is a block diagram showing another variation of the device of FIG. 20.
Figure 26:
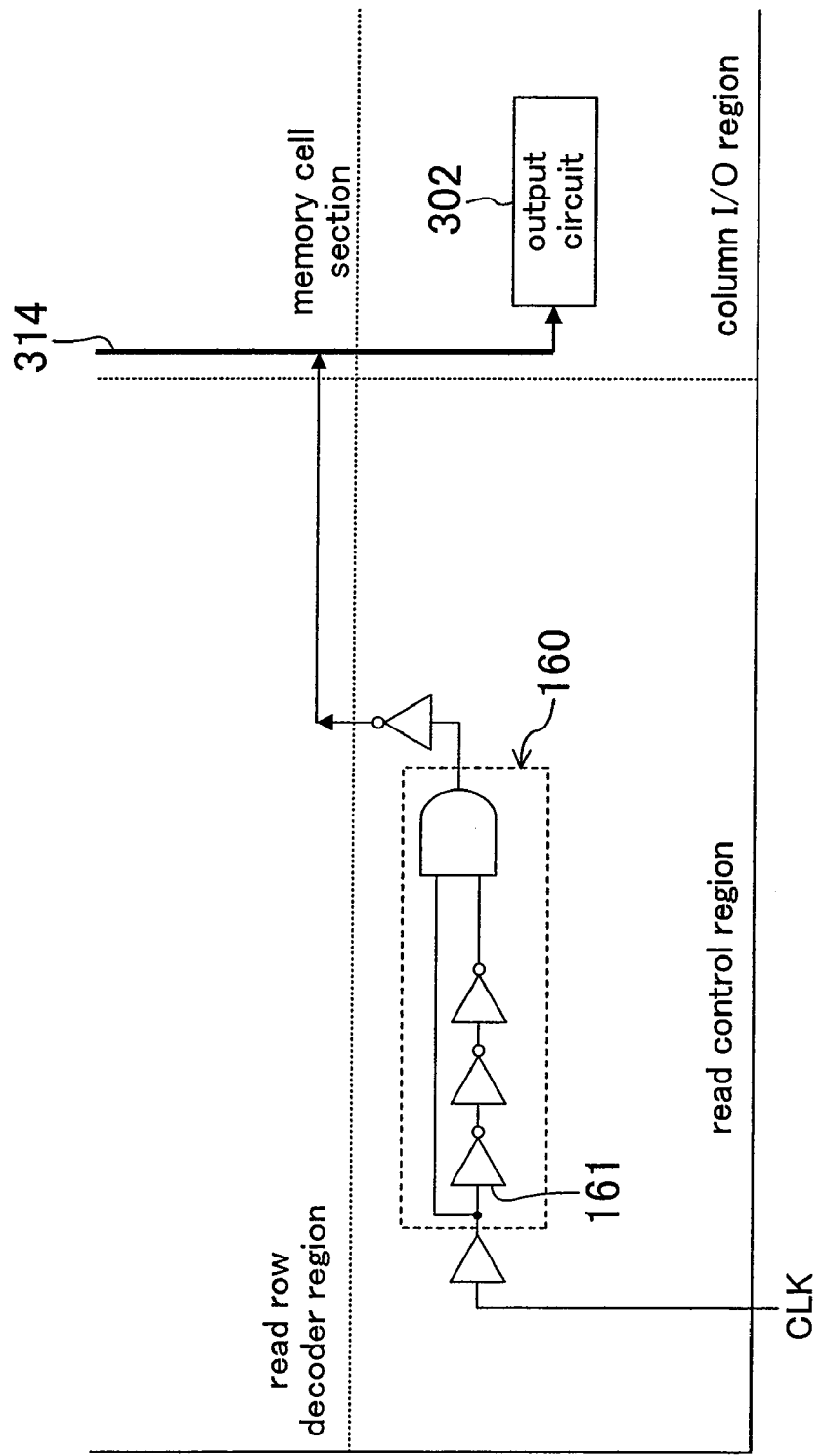
FIG. 26 is a block diagram showing still another variation of the device of FIG. 20.

Also, as shown in FIG. 25, the delay adjusting circuit 163 may be caused to additionally have a delay time corresponding to a delay time due to the replica local read bit line 312 or the replica local amplifier 313. Further, as shown in FIG. 26, a one-shot pulse generating circuit 160 having a delay element 161 may be used to supply an output pulse thereof as a timing signal via the replica global read bit line 314 to the output circuit 302. Thereby, a simple circuit configuration can be used to perform a timing control, depending on the length and parasitic capacitance of the replica global read bit line 314. Therefore, it is possible to suppress the number of steps of additionally developing a special replica memory cell which performs an operation where the potential is invariably fixed to "H" or "L" instead of holding write data, as is different from typical memory cells shown in FIG. 22, for example.

Figure 27:
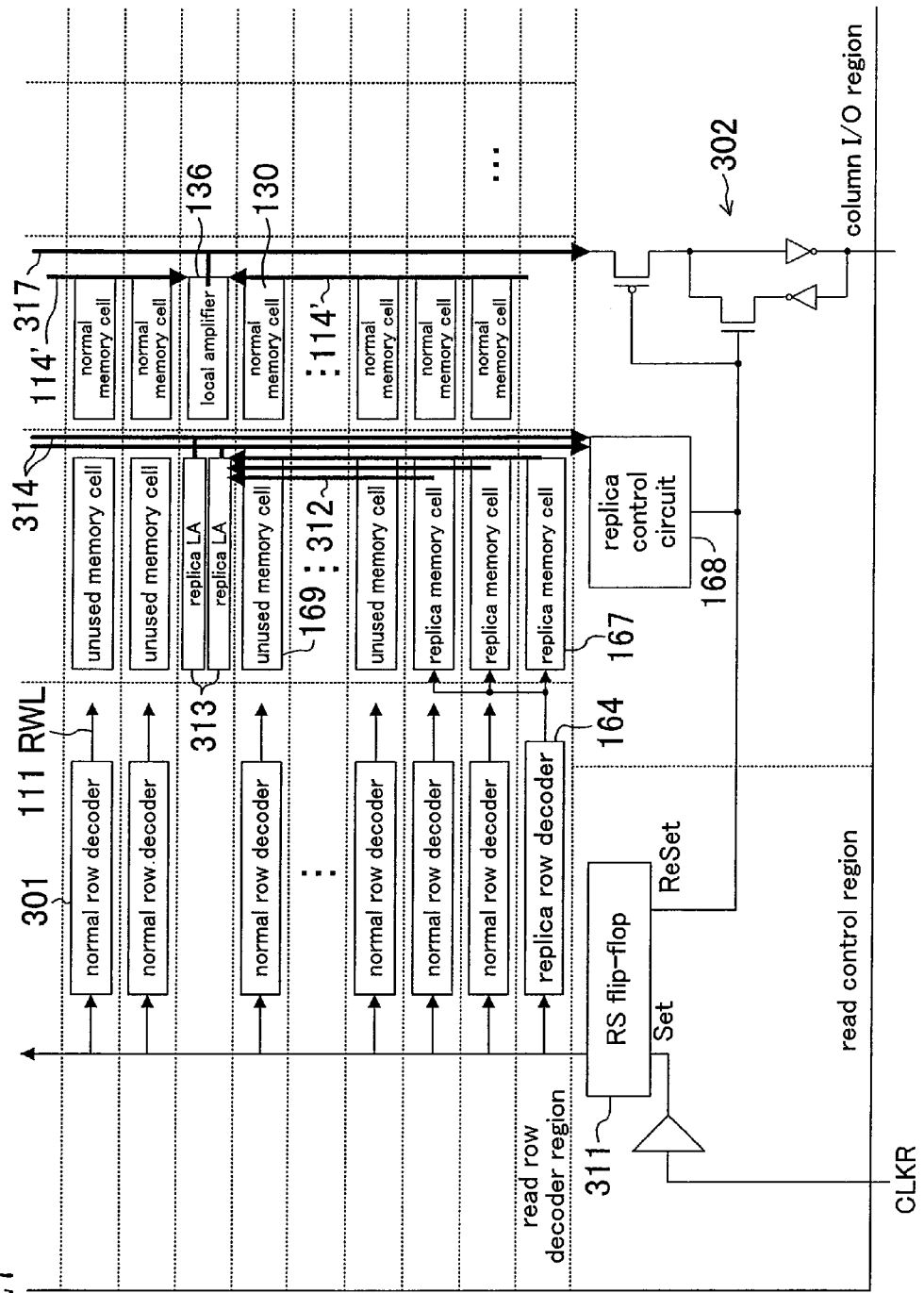
FIG. 27 is a block diagram showing even still another variation of the device of FIG. 20.
Figure 28:
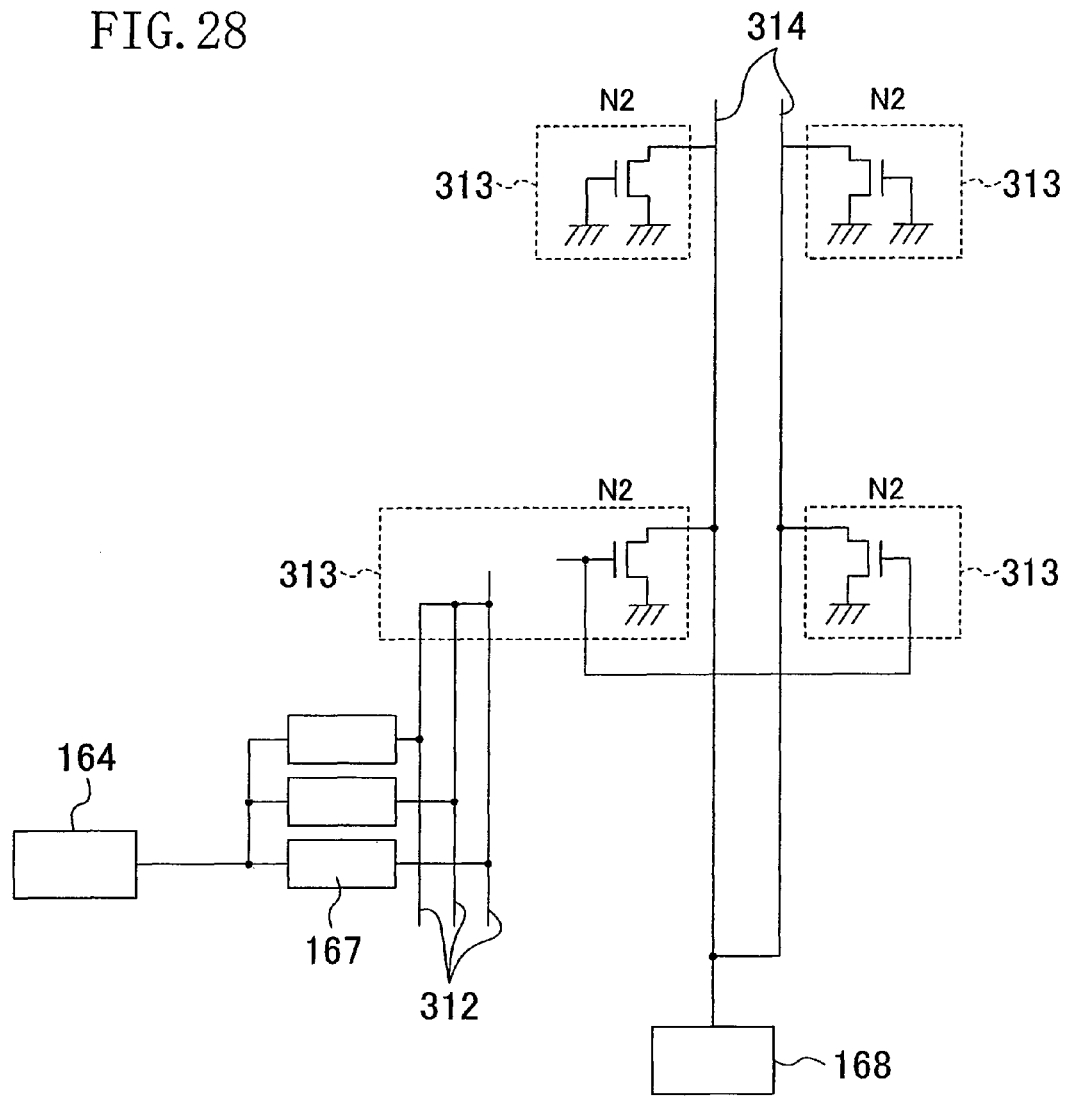
FIG. 28 is a circuit diagram showing a configuration of a major portion of the variation of FIG. 27.

Also, when the replica memory cell 167 and/or the replica local amplifier 313 are used as a drive circuit, a plurality of or a plurality of sets of replica memory cells 167 and/or replica local amplifiers 313 are provided in parallel (where three replica memory cells 167 and two sets of replica local amplifiers 313), and replica local read bit lines 312 and/or replica global read bit lines 314 having a corresponding number or length as a circuit to be driven may be provided in parallel or in a linear manner, as shown in FIGS. 27 and 28. Thus, by providing a plurality of drive circuits or circuits to be driven, the influence of variations in characteristics can be averaged and reduced, and an increase in driving ability of the drive circuits and an increase in parasitic capacitance of the circuits to be driven are balanced, thereby making it possible to generate a delay time substantially equal to when only one drive circuit and only one circuit to be driven are provided. In the above-described case, a circuit to which a signal on the replica local bit line 312 is input may be provided in only one of the replica local amplifiers 313, and the two N-channel transistors N2 may be controlled by an output of the circuit.

Embodiment 5

An exemplary semiconductor memory device will be described in which, even when the number of memory cells in one memory cell group is different from that of another memory cell group, reliable read can be easily performed.

Figure 29:
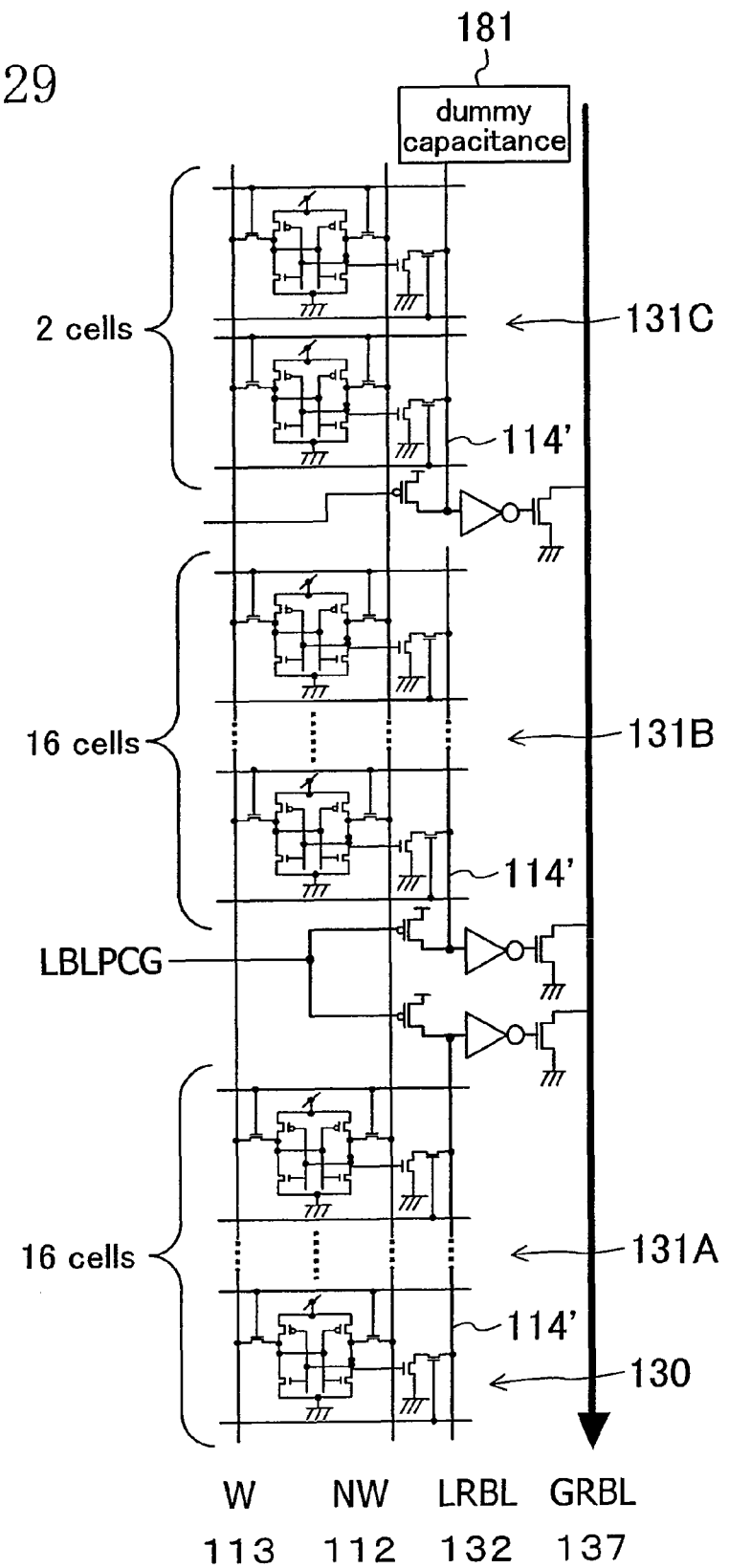
FIG. 29 is a circuit diagram showing a configuration of a major portion of a semiconductor memory device according to Embodiment 5 of the present invention.

In the semiconductor memory device of Embodiment 5, three memory cell groups 131A to 131C are provided as shown in FIG. 29, for example. Sixteen memory cells 130 are provided in each of the memory cell groups 131A and 131B, while two memory cells 130 are provided in the memory cell group 131C. Therefore, both the length and wiring capacitance of a local read bit line 114' for the memory cell group 131C is smaller than those of local read bit lines 114' for the memory cell groups 131A and 131B. However, a dummy capacitance 181 is connected to the local read bit line 114' for the memory cell group 131C, so that the sum of the wiring capacitance and the dummy capacitance is caused to be equal to that of the local read bit lines 114' for the memory cell groups 131A and 131B.

The above-described adjustment is particularly useful for correct read in a semiconductor memory device having a hierarchical bit line structure with a relatively small bit line capacitance since a slight difference in bit line capacitance has a large influence on read timing.

Figure 30:
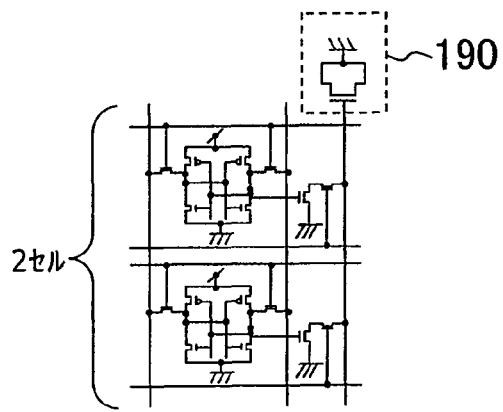
FIG. 30 is a circuit diagram showing a specific configuration of a dummy capacitance of the device of FIG. 29.
Figure 31:
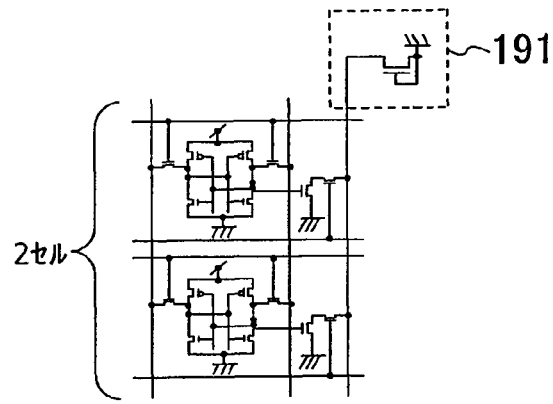
FIG. 31 is a circuit diagram showing another specific configuration of the dummy capacitance of the device of FIG. 29.

Specifically, as the dummy capacitance 181, an inter-wiring capacitance formed by a wiring pattern may be used. Alternatively, for example, as shown in FIG. 30, the source electrode and the drain electrode of a MOS transistor 190 are connected to each other so that a gate capacitance between these and the gate electrode can be used. Also, as shown in FIG. 31, the source electrode and the gate electrode may be connected to each other so that a diffusion capacitance between these and the drain electrode may be used. In these cases, a particular manufacture process is not required and, in addition, since a gate oxide film is generally thinner than an inter-wiring film thickness or the like, a large capacitance can be formed with a small area, thereby making it possible to easily increase the area efficiency of a semiconductor substrate.

Figure 32:
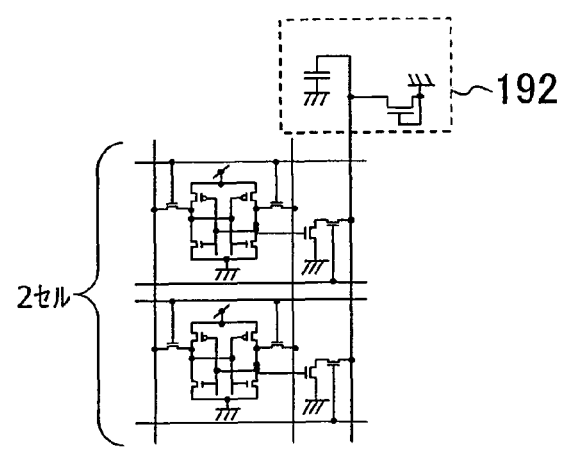
FIG. 32 is a circuit diagram showing still another specific configuration of the dummy capacitance of the device of FIG. 29.
Figure 33:
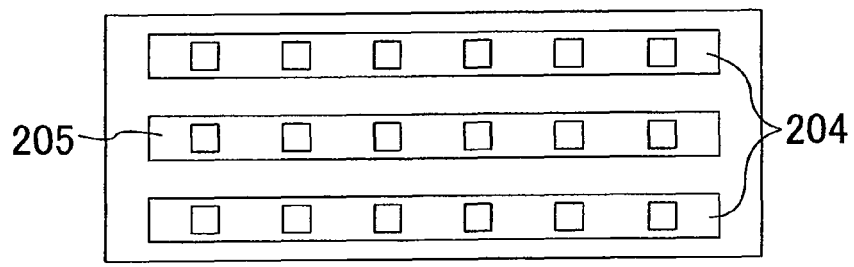
FIG. 33 is a plan view showing a pattern of a diffusion layer of the dummy capacitance of the device of FIG. 29.
Figure 34:
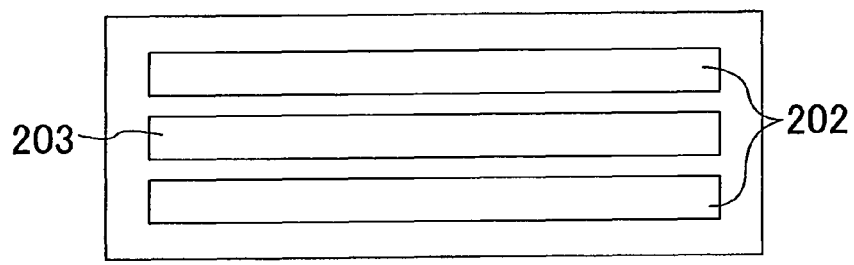
FIG. 34 is a plan view showing a wiring pattern of a first wiring layer of the dummy capacitance of the device of FIG. 29.
Figure 35:
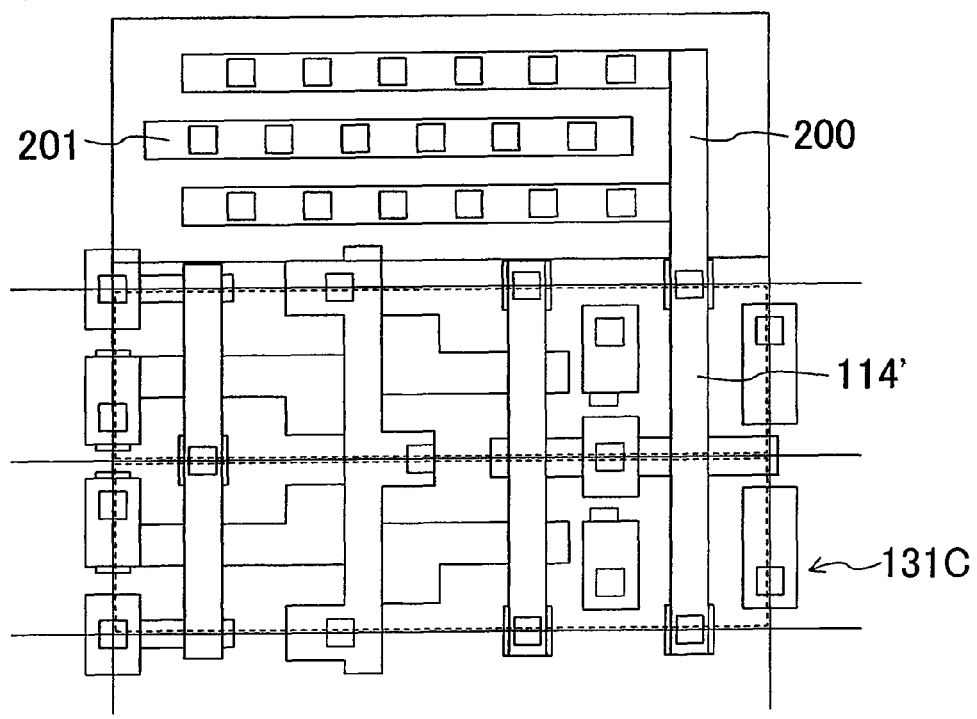
FIG. 35 is a plan view showing a wiring pattern of a second wiring layer of the dummy capacitance of the device of FIG. 29.

Also, as shown in FIG. 32, a plurality of kinds of capacitances, such as an inter-wiring capacitance, a diffusion capacitance, and the like, may be combined. More specifically, as shown in FIGS. 33 to 35, diffusion layers 204 and 205 are formed on a semiconductor substrate, wiring patterns 202 and 203 are formed in a first wiring layer, and wiring patterns 200 and 201 are formed in a second wiring layer. The wiring pattern 200 is connected to the local read bit line 114' of the memory cell group 131C and is also connected via a via hole to the wiring pattern 202 and the diffusion layer 204. Also, the wiring pattern 201, the wiring pattern 203, and the diffusion layer 205 are connected to each other via a via hole and are also grounded.

Thus, when a dummy capacitance is formed by a diffusion layer or a wiring layer as is similar to formation of a bit line capacitance, a highly precise dummy capacitance can be easily formed, depending on variations in diffusion capacitance due to variations in implanted impurity, or variations in conductor width, wiring film thickness, inter-wiring layer film, via hole diameter, or the like. Therefore, even in a memory cell group having an odd word number, highly-precise read can be easily performed, thereby making it possible to increase the yield. Note that a wiring pattern or a diffusion region may be formed or arranged into a shape more similar to a shape of a memory cell.

Embodiment 6

Figure 36:
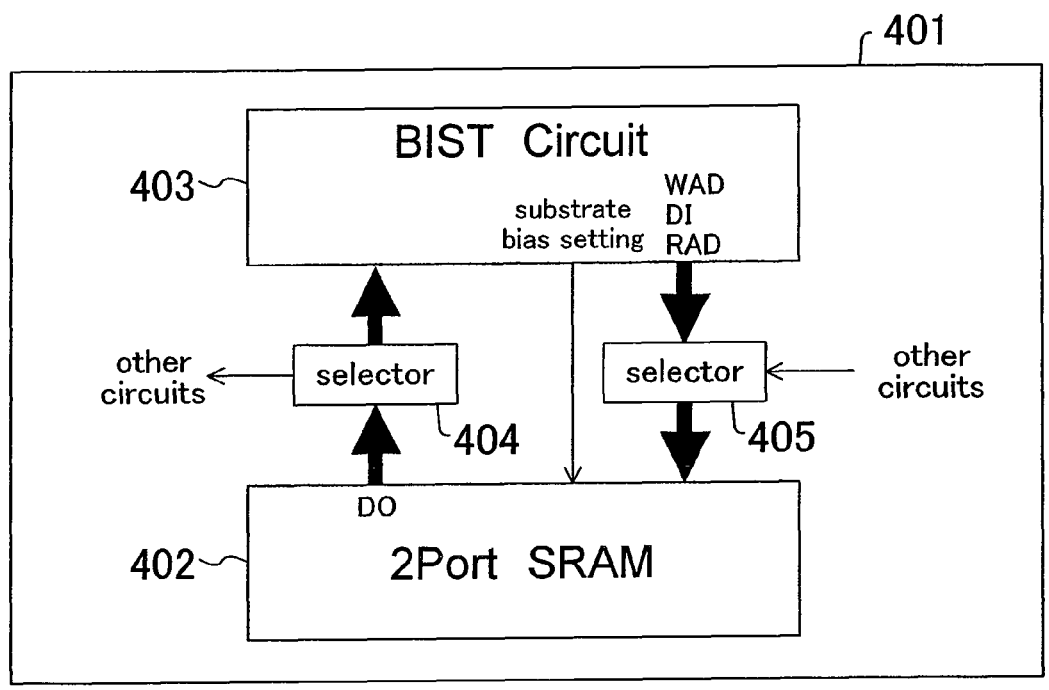
FIG. 36 is a block diagram schematically showing a configuration of a semiconductor memory device according to Embodiment 6 of the present invention.

As shown in FIG. 36, a semiconductor memory device 401 of Embodiment 6 comprises, for example, a dual-port SRAM 402, a BIST circuit 403 (Built In Self Test circuit), and selectors 404 and 405.

When the dual-port SRAM 402 is tested, the selectors 404 and 405 switch an input/output signal of the dual-port SRAM 402 from other circuits in the semiconductor memory device 401 to the BIST circuit 403. Although various signals other than those shown in the figure are also input to or output from the dual-port SRAM 402, they are not shown for the sake of simplicity.

Figure 37:
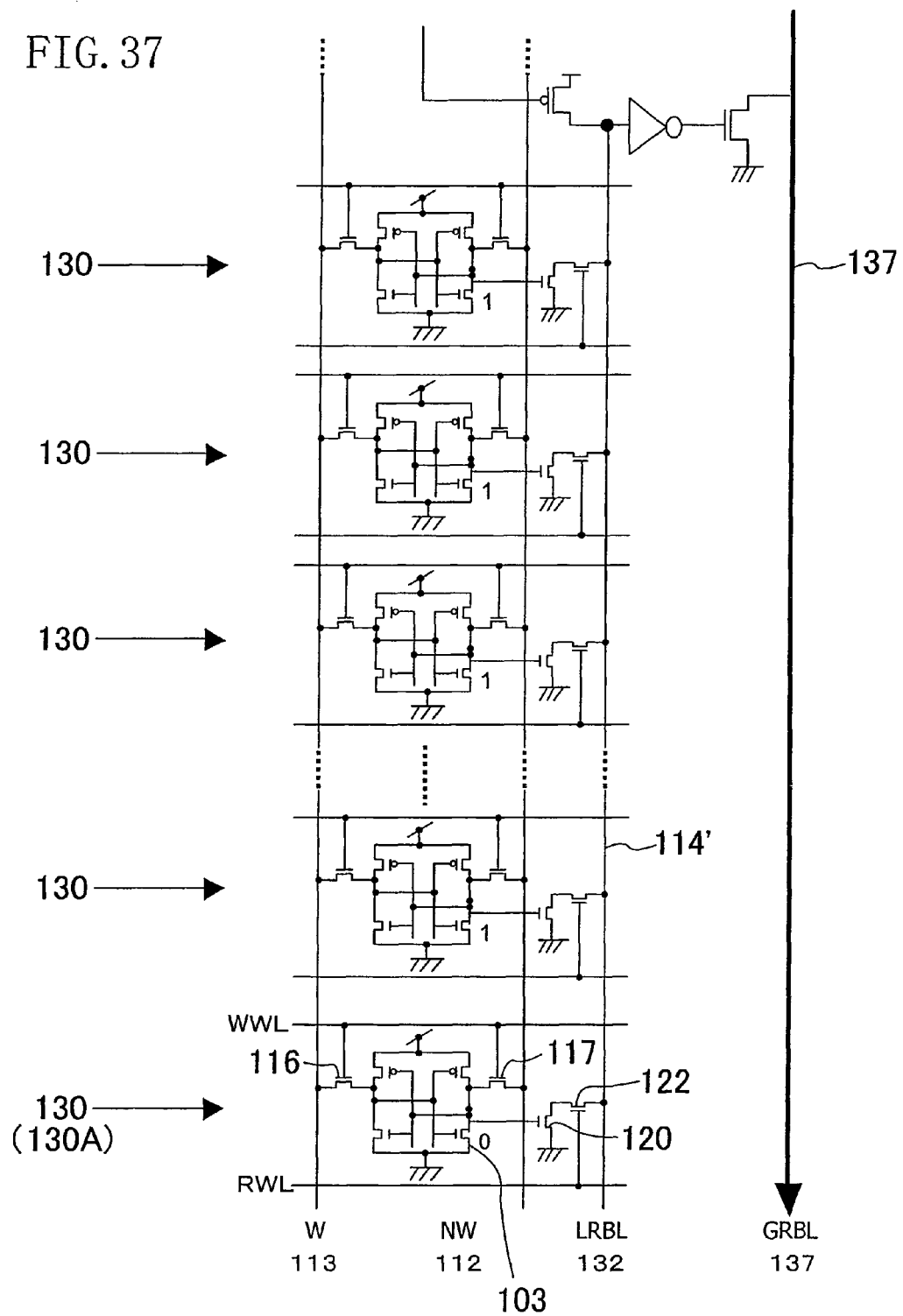
FIG. 37 is a circuit diagram showing a configuration of a major portion of the device of FIG. 36.
Figure 38:
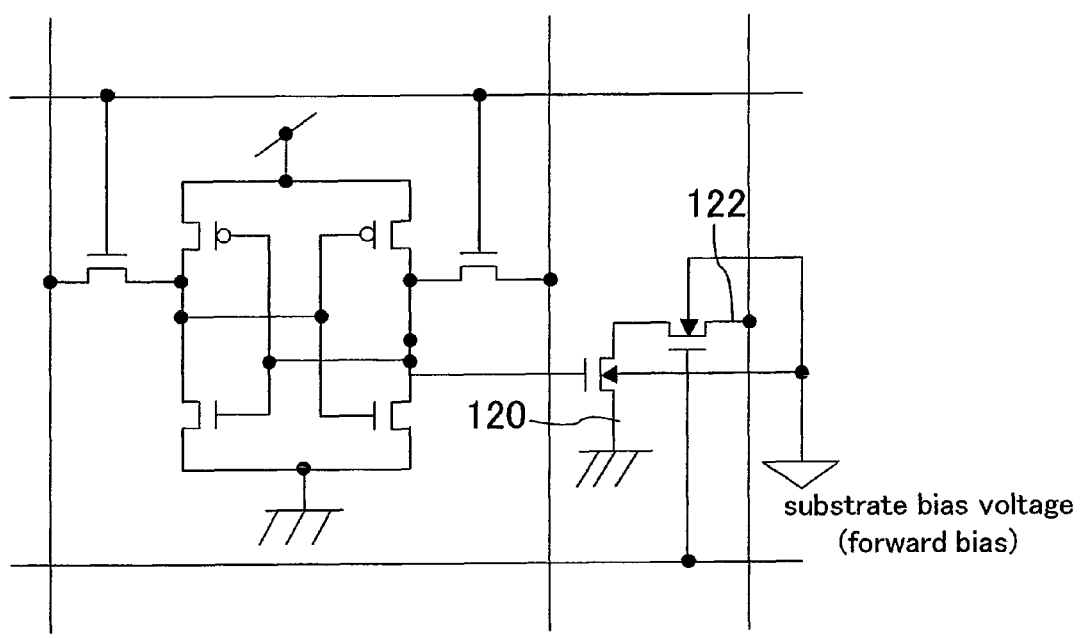
FIG. 38 is a circuit diagram showing a configuration of a memory cell of the device of FIG. 36.

The dual-port SRAM 402 includes memory cells 130 each having a holding circuit 103, write access transistors 116 and 117, a read drive transistor 120, and a read access transistor 122 as shown in FIG. 37, for example. As shown in FIG. 38, in the read drive transistor 120 and the read access transistor 122, a substrate potential is separated from a source potential, so that a predetermined forward bias can be applied. For example, the forward bias is set so that the threshold voltages of the read drive transistor 120 and the read access transistor 122 are equal to a threshold voltage at the highest ambient temperature that is acceptable in specifications.

For example, when a memory cell 130A in the dual-port SRAM 402 is tested, the BIST circuit 403 initially writes, into the memory cell 130A, data for which the read drive transistor 120 is switches OFF, and writes, into all the other memory cells 130, data for which the read drive transistor 120 is switched ON. Also, the predetermined forward bias is applied to the read drive transistor 120 and the read access transistor 122. In this state, both the write word line 110 and the read word line 111 which are connected to the memory cell 130A are switched ON while the write bit lines 112 and 113 are maintained at "H". Specifically, while the memory cell 130A is selected as a cell from which memory data is to be read, data is read from the memory cell 130A in the same state in which data is written into a memory cell in another column of the same row of the memory cell 130A in the case of a multi-column structure.

In the above-described state, the potential of the global read bit line 137 decreases most quickly with respect to reading of data to be maintained. Therefore, even in this case, if it is determined that the "data for which the potential of the global read bit line 137 should be maintained" has been read out, erroneous read does not occur due to delayed read timing. On the other hand, when it is determined that erroneous read has occurred, the device may be determined as a defective product, or alternatively, the defective memory cell may be replaced with a previously provided redundant memory cell. Also, a test may be newly performed under reduced conditions for specifications.

As described above, a test can be performed, taking into consideration an influence during writing of data into a memory cell when reading of memory data is performed from another memory cell in the same row, an influence of an off-leakage current of a read access transistor in another memory cell in the same column, and an influence of high ambient temperature (a substrate voltage corresponding thereto). Thereby, it can be correctly determined whether or not a tested device is defective. In addition, the test cost can be significantly reduced as compared to when the test is performed at actual high ambient temperature.

Note that, in addition to the above-described test, a test may be performed with respect to data for which the potential of the global read bit line 137 should decrease, so as to determine whether or not the "data for which the potential of the global read bit line 137 should decrease" has been read out, under reverse conditions that the potential decreases most slowly.

Also, a transistor to which a substrate voltage separated from a source voltage is applied is not limited to that which has been described above. A predetermined substrate voltage may be applied to a transistor of the holding circuit 103, the write access transistors 116 and 117, or the like so that a test can be performed under more severe conditions. Further, for example, when a memory having the local amplifier 136 described in Embodiment 2 (FIG. 7) is tested, a predetermined forward bias may be applied to the substrates of the P-channel transistors P9 to P16 included in the local amplifier 136 so as to perform a test under more severe conditions.

Also, the above-described testing technique may be applied to a memory including memory cells which do not have a read drive transistor. In this case, as described above, an influence of simultaneous read and write does not occur with respect to memory cells in the same row, and is not taken into consideration for test conditions. However, a test can be performed, taking into consideration an influence of an off-leakage current of a read access transistor or the like.

Also, memory cells may be individually, automatically, or continuously tested.

Also, the above-described application of a substrate voltage is not necessarily required. In this case, a test can be performed as to whether or not a device is defective due to other factors. On the other hand, the BIST circuit 403 may not be provided and only application of a substrate voltage may be allowed and may be performed when a test is manually performed.

Note that the constituent elements described in the embodiments and variations above may be combined in various manners within a logically possible range. Specifically, for example, a memory cell having a gate length as described in Embodiment 1 may be used in the other embodiments. A configuration having a local amplifier (146) as described in Embodiment 3 (FIG. 17) may be applied to a configuration having a replica circuit as described in Embodiment 4. A configuration having a dummy capacitance (181) or a BIST circuit (403) as described in Embodiment 5 or 6 may be combined with the configurations of the other embodiments.

Also, a semiconductor memory device to which the present invention is applied is not limited to a discrete device, and may be incorporated into a so-called system LSI or may be used as a register file.

The present invention exhibits a particularly significant effect on a single-end read memory cell and a memory cell having a read drive transistor, though is not limited to these. The present invention can exhibit some specific effects on a complementary bit line read memory cell, a memory cell without a read drive transistor, a memory cell without a read-only output circuit, or the like. Also, the configurations of Embodiment 1 and 6 may be applied to a semiconductor memory device which does not have a hierarchical bit line structure.

Also, the numbers of read and write ports are not limited to those described above. The present invention may be applied to a semiconductor memory device having a combination of two or more various read and write ports.

As described above, it is possible to easily suppress the occurrence of erroneous read or easily reduce power consumption.

What is claimed is:

1. A semiconductor memory device, wherein bit lines for reading memory data have a hierarchical bit line structure, the device comprising:
   a plurality of local blocks each having a plurality of memory cells and a local read bit line to which the memory cells are connected;
   a global read bit line; and
   a local amplifier for driving a global read bit line in accordance with a signal from each local block,
   wherein each memory cell includes:
      a holding circuit for holding memory data; and
      a read output circuit for outputting a signal corresponding to the data held by the holding circuit to a single local read bit line,
   the plurality of local blocks include a small local block including a smaller number of memory cells than those in other local blocks, and
   a capacitance element is connected to the local read bit line of the small local block.

2. The semiconductor memory device of claim 1, wherein the capacitance element includes at least one of a gate capacitance, a diffusion capacitance, and an inter-wiring capacitance of a MIS transistor.

* * * * *